United States Patent
Miyata et al.

(10) Patent No.: US 11,264,490 B2
(45) Date of Patent: Mar. 1, 2022

(54) SEMICONDUCTOR DEVICE AND METHOD OF MANUFACTURING SEMICONDUCTOR DEVICE

(71) Applicants: FUJI ELECTRIC CO., LTD., Kawasaki (JP); DENSO CORPORATION, Kariya (JP)

(72) Inventors: Hiroshi Miyata, Matsumoto (JP); Seiji Noguchi, Matsumoto (JP); Souichi Yoshida, Matsumoto (JP); Hiromitsu Tanabe, Kariya (JP); Kenji Kouno, Kariya (JP); Yasushi Okura, Kariya (JP)

(73) Assignees: FUJI ELECTRIC CO., LTD., Kawasaki (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/204,791

(22) Filed: Nov. 29, 2018

(65) Prior Publication Data

US 2019/0097030 A1    Mar. 28, 2019

Related U.S. Application Data

(63) Continuation of application No. PCT/JP2017/033604, filed on Sep. 15, 2017.

(30) Foreign Application Priority Data

Sep. 20, 2016  (JP) .............................. JP2016-183126

(51) Int. Cl.
*H01L 29/40*    (2006.01)
*H01L 29/739*   (2006.01)
(Continued)

(52) U.S. Cl.
CPC .... *H01L 29/7397* (2013.01); *H01L 21/76816* (2013.01); *H01L 29/0696* (2013.01);
(Continued)

(58) Field of Classification Search
CPC ......... H01L 21/76816; H01L 29/41766; H01L 29/7397; H01L 29/0804; H01L 29/41708;
(Continued)

(56) References Cited

U.S. PATENT DOCUMENTS

| | | | |
|---|---|---|---|
| 2008/0054326 A1 | 3/2008 | Wong et al. | |
| 2012/0025283 A1* | 2/2012 | Son ................... | H01L 27/10855 257/296 |

(Continued)

FOREIGN PATENT DOCUMENTS

| | | |
|---|---|---|
| CN | 103918062 A | 7/2014 |
| JP | 6310729 A | 11/1994 |

(Continued)

OTHER PUBLICATIONS

International Search Report dated Dec. 5, 2017 in corresponding International Application No. PCT/JP2017/033604.

(Continued)

*Primary Examiner* — Shih Tsun A Chou

(57) ABSTRACT

A plug electrode is subject to etch back to remain in a contact hole and expose a barrier metal on a top surface of an interlayer insulating film. The barrier metal is subject to etch back, exposing the top surface of the interlayer insulating film. Remaining element structures are formed. After lifetime is controlled by irradiation of helium or an electron beam, hydrogen annealing is performed. During the hydrogen annealing, the barrier metal is not present on the interlayer insulating film covering a gate electrode, enabling hydrogen atoms to reach a mesa part, whereby lattice defects generated in the mesa part by the irradiation of helium or an (Continued)

electron beam are recovered, recovering the gate threshold voltage. Thus, predetermined characteristics of a semiconductor device having a structure where a plug electrode is provided in a contact hole, via barrier metal are easily and stably obtained when lifetime control is performed.

13 Claims, 39 Drawing Sheets

(51) Int. Cl.
*H01L 29/08* (2006.01)
*H01L 29/10* (2006.01)
*H01L 29/66* (2006.01)
*H01L 29/423* (2006.01)
*H01L 21/768* (2006.01)
*H01L 29/06* (2006.01)
*H01L 29/861* (2006.01)
*H01L 29/417* (2006.01)
*H01L 29/45* (2006.01)

(52) U.S. Cl.
CPC ...... *H01L 29/0804* (2013.01); *H01L 29/0821* (2013.01); *H01L 29/0834* (2013.01); *H01L 29/1004* (2013.01); *H01L 29/401* (2013.01); *H01L 29/417* (2013.01); *H01L 29/42368* (2013.01); *H01L 29/42376* (2013.01); *H01L 29/456* (2013.01); *H01L 29/66348* (2013.01); *H01L 29/7396* (2013.01); *H01L 29/8613* (2013.01)

(58) Field of Classification Search
CPC ........... H01L 29/66348; H01L 29/0821; H01L 29/1004; H01L 29/42368; H01L 29/42376; H01L 29/401
See application file for complete search history.

(56) References Cited

U.S. PATENT DOCUMENTS

| | | | |
|---|---|---|---|
| 2012/0199900 A1 | 8/2012 | Oosawa et al. | |
| 2013/0082301 A1* | 4/2013 | Onozawa | H01L 29/36 257/139 |
| 2013/0149853 A1 | 6/2013 | Horii | |
| 2014/0302621 A1* | 10/2014 | Niimura | H01L 21/2636 438/14 |
| 2016/0079375 A1* | 3/2016 | Yamazaki | H01L 29/4238 257/330 |
| 2016/0163647 A1* | 6/2016 | Iwasaki | H01L 21/76832 257/751 |
| 2017/0141216 A1* | 5/2017 | Abe | H01L 29/0619 |

FOREIGN PATENT DOCUMENTS

| | | |
|---|---|---|
| JP | 7249629 A | 9/1995 |
| JP | 2010503224 A | 1/2010 |
| JP | 2011181840 A | 9/2011 |
| JP | 201269861 A | 4/2012 |
| JP | 2012164854 A | 8/2012 |
| JP | 2013122982 A | 6/2013 |
| JP | 2013232560 A | 11/2013 |
| JP | 2016115735 A | 6/2016 |
| WO | 2016125490 A1 | 8/2016 |

OTHER PUBLICATIONS

Written Opinion of the International Searching Authority dated Dec. 5, 2017 in corresponding International Application No. PCT/JP2017/033604.

* cited by examiner

FIG.28
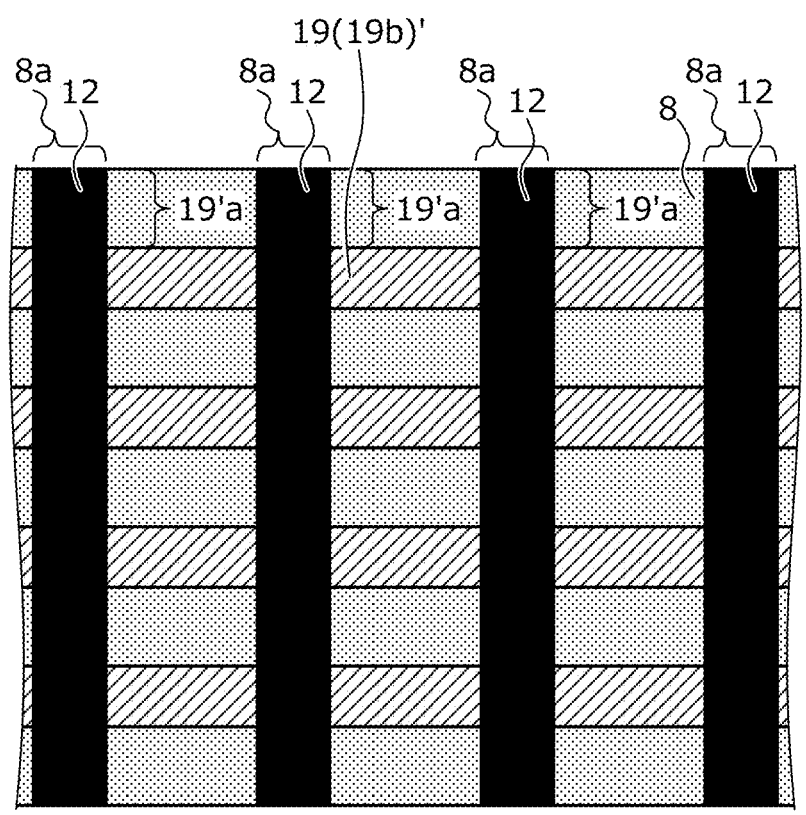
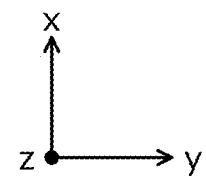

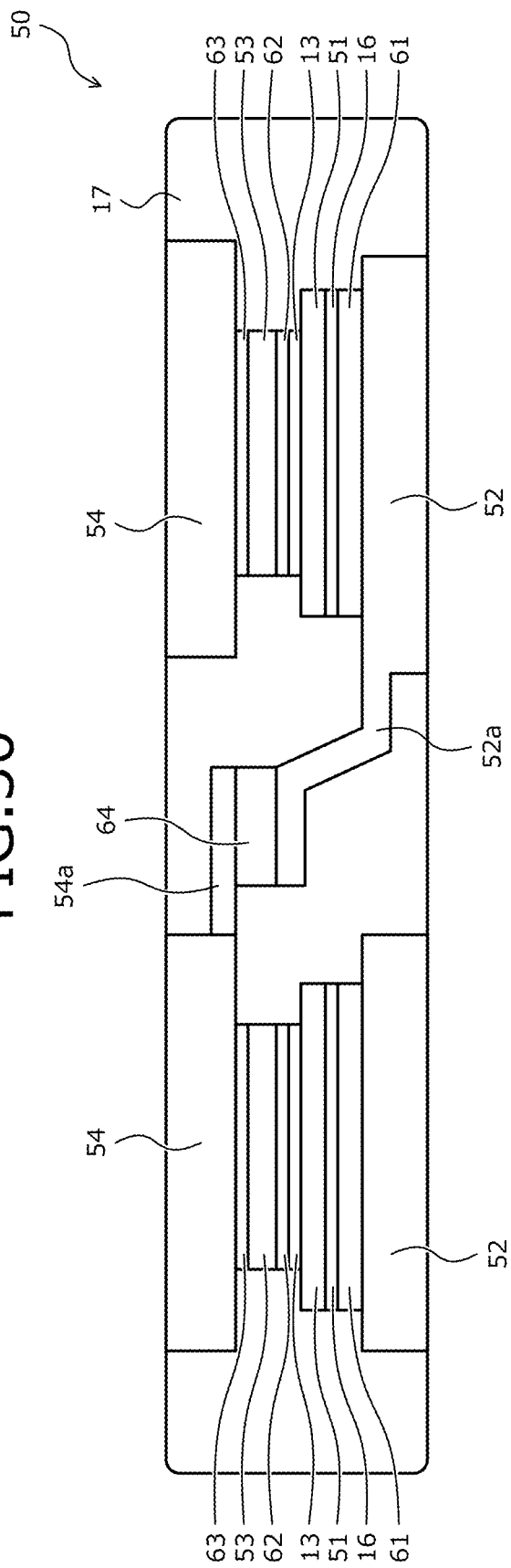

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2017/033604 filed on Sep. 15, 2017 which claims priority from a Japanese Patent Application No. 2016-183126 filed on Sep. 20, 2016, the contents of which are incorporated herein by reference.

BACKGROUND

1. Field

Embodiments of the invention relate to a semiconductor device and a method of manufacturing a semiconductor device.

2. Description of Related Art

Conventionally, in a semiconductor device having a trench gate structure in which an insulated gate constituted by a metal oxide film semiconductor (MOS) is embedded in a trench formed in a semiconductor substrate, trench pitch (interval at which trenches are disposed) is reduced to improve characteristics. Reduction of the trench pitch, reduces a width (mesa part) between adjacent trenches, whereby a width of a contact hole forming a contact (electrical contact part) of a front electrode and a semiconductor part decreases. When a sputtering technique is used to embed the front electrode in the contact hole having a small width, voids occur in the front electrode.

A structure (hereinafter, first conventional structure) known as a structure to resolve this problem, includes a plug electrode embedded in a contact hole. The plug electrode contains, as a material, tungsten (W), which has a high embedding property. The plug electrode electrically connects a front electrode and a semiconductor part. A structure of a conventional semiconductor device will be described taking as an example, a vertical insulated gate bipolar transistor (IGBT) having a trench gate structure depicted in FIG. 24. FIG. 24 is a cross-sectional view of a structure of a conventional semiconductor device.

In the first conventional structure depicted in FIG. 24, a plug electrode 212 is embedded in a contact hole 210a. Tungsten, a material of the plug electrode 212, has poor adhesiveness with silicon (Si), a material of a semiconductor substrate 200. Therefore, a barrier metal 211 having high adhesiveness with the semiconductor part and made of a metal enabling formation of an ohmic contact with the semiconductor part is provided between the plug electrode 212 and a semiconductor part ($n^+$-type emitter region 203). The barrier metal 211, for example, is a metal film constituted by a titanium (Ti) film and a titanium nitride (TiN) film that are sequentially stacked.

The barrier metal 211 is provided along an inner wall of the contact hole 210a and a surface of the interlayer insulating film 210, and covers the surface of the interlayer insulating film 210. A front electrode 213 is in contact with the barrier metal 211 and the plug electrode 212 on the interlayer insulating film 210, and is electrically connected with a p-type base region 202 and the $n^+$-type emitter region 203. In FIG. 24, while a trench gate structure on a front surface side of the semiconductor substrate 200 is depicted, a $p^+$-type collector region and a collector electrode on a rear surface side are not depicted. Reference numerals 201, 204, 205, 206, and 207 are an $n^-$-type drift layer, a MOS gate, a trench, gate insulating film, and a gate electrode.

To control lifetime of a semiconductor device having such a trench gate structure, helium (He) or an electron beam may irradiated to introduce into the drift layer, lattice defects that are lifetime killers. In this case, voids (V) (hereinafter, lattice defects) are also generated in the mesa part and gate threshold voltage decreases. Therefore, after irradiation of helium or an electron beam, heat treatment (hydrogen annealing) has to be performed in a hydrogen ($H_2$) atmosphere for recovery of lattice defects in the mesa part and for recovery of the gate threshold voltage. During this hydrogen annealing, aluminum (Al) through which hydrogen atoms can pass is used as a material of the front electrode 213 so that the hydrogen atoms in the hydrogen atmosphere will pass through the front electrode 213 and reach the mesa part.

However, when the plug electrode 212 is embedded in the contact hole 210a, via the barrier metal 211, as described, the entire surface of the interlayer insulating film 210 is covered by the barrier metal 211. Therefore, during the hydrogen annealing, diffusion of the hydrogen atoms from a front electrode 213 side toward the interlayer insulating film 210 is suppressed by the barrier metal 211. As a result, since the hydrogen atoms do not reach the surface of the semiconductor substrate 200, recovery of the lattice defects in the mesa part cannot occur. In other words, when lifetime control is performed in a semiconductor device having a structure in which the plug electrode 212 is embedded in the contact hole 210a, via the barrier metal 211, recovery of the gate threshold voltage that decreases due to the lifetime control cannot be recovered.

As a method of solving this problem, one method proposes forming a first metal film (metal film in contact with a semiconductor part) of the barrier metal using a group VIII metal material such as nickel (Ni) or cobalt (Co) instead of titanium (for example, refer to Japanese Laid-Open Patent Publication No. 2011-181840). In Japanese Laid-Open Patent Publication No. 2011-181840, by changing the material of the first metal film of the barrier metal, during the hydrogen annealing performed after the electron beam irradiation, etc., occlusion of the hydrogen atoms in the first metal film is prevented.

According to another proposed method, when a titanium-tungsten (TiW) based barrier metal is formed on a device main surface by sputtering, titanium concentration of the TiW target is set to be in a range from 2% by weight to 8% by weight (e.g., refer to Japanese Laid-Open Patent Publication No. 2012-069861). In Japanese Laid-Open Patent Publication No. 2012-069861, a titanium concentration of a metal film containing titanium is controlled, weakening a hydrogen trap effect and securing a recovery effect of the gate threshold voltage by hydrogen annealing.

According to yet another method, at a location where a semiconductor part and a front electrode contact a barrier metal is disposed, and in a part where a semiconductor part and the front electrode do not contact, the barrier metal is not disposed (e.g., refer to Japanese Laid-Open Patent Publication No. H06-310729). In Japanese Laid-Open Patent Publication No. H06-310729, the barrier metal is selectively removed by patterning, whereby the barrier metal remains continuously from the surface of the semiconductor part only at a side surface (side wall of a contact hole) of the interlayer insulating film.

Further, as a method of selectively removing a barrier metal, a method has been proposed in which an excess tungsten film above a contact hole is removed by a chemical mechanical polishing (CMP) process, and a barrier metal of a surface of an interlayer insulating film is also removed by the CMP process (e.g., refer to Published Japanese-Translation of PCT Application, Publication No. 2010-503224 (paragraph 0029, FIGS. 6, 7)).

Further, as a method of preventing degradation of electrical characteristics of the gate threshold voltage, a method has been proposed in which electromagnetic waves are irradiated, thereby heating an interlayer insulating film and performing heat treatment (reflow), whereby unevenness generated at a surface of the interlayer insulating film during deposition is planarized (e.g., refer to Japanese Laid-Open Patent Publication No. H07-249629 (paragraph 0013, FIG. 2).

SUMMARY

According to an embodiment of the present invention, a method of manufacturing a semiconductor device includes forming an insulating film on a first main surface of a semiconductor substrate; forming a contact hole penetrating the insulating film in a depth direction and reaching semiconductor substrate; forming a metal film from a surface of the insulating film and spanning a semiconductor part of the semiconductor substrate exposed in the contact hole, the metal film having high adhesiveness with the semiconductor part; forming a metal layer on a surface of the metal film so as to be embedded in the metal film in the contact hole; performing etch back of the metal layer, removing a part of the metal layer excluding a part embedded in the contact hole, and exposing the metal film; performing etch back of an exposed part of the metal film, and exposing the insulating film; irradiating a light ion or an electron beam on the semiconductor substrate; and performing heat treatment in a hydrogen atmosphere and recovering lattice defects generated by irradiating the light ion or the electron beam.

In the embodiment, forming the insulating film includes forming as the insulating film, a silicon oxide film containing boron at an impurity concentration in a range from 2.6 wt % to 3.8 wt % and phosphorus at an impurity concentration in a range from 3.6 wt % to 4.4 wt %.

In the embodiment, performing etch back of the metal layer includes performing etch back of the metal layer until a surface of the metal layer is positioned within the contact hole.

In the embodiment, performing etch back of the exposed part of the metal film includes performing etch back of the metal film so that of the insulating film, an upper end of a side surface forming a side wall of the contact hole is exposed.

In the embodiment, forming the contact hole includes forming the contact hole and forming a first groove in a part of the semiconductor substrate exposed in the contact hole, and forming the metal film includes forming the metal film so as to be embedded in the first groove.

In the embodiment, forming the insulating film includes forming the insulating film to have a thickness that is at least equal to a width of the contact hole.

In the embodiment, the method further includes forming a gate electrode on a gate insulating film, in a trench formed at a predetermined depth from the first main surface of the semiconductor substrate, the gate electrode being formed before forming the insulating film. Forming the gate electrode includes forming the gate electrode so that a surface of the gate electrode is within the trench. Forming the insulating film includes: forming the insulating film so as to cover the gate electrode, and forming the insulating film to have at a part thereof other than a part on the gate electrode, a thickness that is at least equal to a width of the contact hole.

In the embodiment, forming the gate electrode includes disposing the trench in plural at an interval narrower than a width of the trench.

In the embodiment, performing the heat treatment includes recovering the lattice defects generated in a part of the semiconductor substrate sandwiched between adjacent trenches.

In the embodiment, forming the gate electrode includes: forming the trench in plural in a first formation region and a second formation of the semiconductor substrate that is of a first conductivity type, the first formation region having a first semiconductor element formed therein and the second formation region having a second semiconductor element formed therein; forming the gate electrode on the gate insulating film in the trench; forming a first semiconductor region of a second conductivity type in a part of the semiconductor substrate sandwiched between adjacent trenches of the plural trenches, the first semiconductor region being formed so as to oppose the gate electrode across the gate insulating film; and selectively forming a second semiconductor region of the first conductivity type in the first semiconductor region of the first formation region, the second semiconductor region being formed so as to oppose the gate electrode across the gate insulating film. The method further includes after performing etch back of the exposed part of the metal film and before irradiating the light ion or the electron beam: forming a first electrode in contact with the first semiconductor region and the second semiconductor region of the first formation region and in contact with the first semiconductor region of the second formation region; forming in the first formation region, a third semiconductor region of the second conductivity type in a surface layer on a second main surface of the semiconductor substrate, and forming in second formation region, a fourth semiconductor region of the first conductivity type in the surface layer on the second main surface of the semiconductor substrate, the fourth semiconductor region having an impurity concentration that is higher than that of the semiconductor substrate; and forming a second electrode in contact with the third semiconductor region and the fourth semiconductor region.

In the embodiment, forming the metal film includes forming as the metal film, a titanium film and titanium nitride film that are sequentially stacked.

In the embodiment, forming the metal layer includes forming as the metal layer, a tungsten layer.

According to another embodiment of the present invention, a semiconductor device includes a plurality of trenches provided at a predetermined depth from a first main surface of a semiconductor substrate; a gate electrode provided in a gate insulating film in the plurality of trenches; an insulating film provided on the first main surface of the semiconductor substrate and covering the gate electrode; a contact hole penetrating the insulating film in a depth direction and reaching the semiconductor substrate; a metal film provided from a side wall of the contact hole and spanning a surface of a semiconductor part of the semiconductor substrate exposed in the contact hole, the metal film having a high adhesiveness with the semiconductor part; a metal layer embedded in the metal film in the contact hole; and a first electrode provided at a surface of the metal layer and the insulating film. A surface of the gate electrode is positioned within the trench.

In the embodiment, the insulating film is a silicon oxide film containing boron at an impurity concentration in a range from 2.6 wt % to 3.8 wt % and phosphorus at an impurity range from 3.6 wt % to 4.4 wt %.

In the embodiment, the insulating film has a part that is on the gate electrode and that has a thickness equal to a sum of a thickness of a part of the insulating film other than the part on the gate electrode and a depth from the first main surface of the semiconductor substrate to the surface of the gate electrode.

In the embodiment, lattice defects are introduced in a part of the semiconductor substrate other than a part sandwiched between adjacent trenches of the plurality of trenches, the lattice defects being introduced by irradiation of light ions or an electron beam.

In the embodiment, the metal film is positioned closer to the semiconductor part than is a corner part where a surface of the insulating film facing toward the first electrode and a side surface of the insulating film exposed at the contact hole meet.

In the embodiment, a second groove having a slit shape is provided in a part of the metal film and penetrates the metal film in a direction of thickness.

In the embodiment, the second groove penetrates the metal film in the direction of thickness and reaches a surface of the insulating film facing toward the first electrode.

In the embodiment, the first electrode covers surfaces of the insulating film and the metal layer overall.

In the embodiment, the first electrode has a stacked structure in which two or more metal electrode films of differing materials are sequentially stacked, and a lowermost metal electrode film of the two or more metal electrode films is an aluminum film or an aluminum alloy film, and covers a part of at least one of the insulating film and the metal layer.

In the embodiment, the first electrode includes a nickel film or a nickel alloy film stacked as an upper layer metal electrode film on the lowermost metal electrode film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 28 is a plan view of another example of a layout when viewing a slit of the barrier metal in FIG. 25 from the front surface side of the semiconductor substrate;

FIG. 30 is a cross-sectional view of a structure at cutting line H-H' in FIG. 29.

DESCRIPTION OF EMBODIMENTS

First, problems associated with the related arts will be described. As described above, in the first conventional structure depicted in FIG. 24, the entire surface of the interlayer insulating film 210 is covered by the barrier metal 211 and therefore, the recovery effect of the gate threshold voltage by hydrogen annealing is not obtained. This problem is solved by a configuration in which the barrier metal is not disposed in a part where a semiconductor part and the front electrode are not in contact like that in Japanese Laid-Open Patent Publication No. H06-310729. In this case, the recovery effect of the gate threshold voltage by hydrogen annealing may be obtained to an extent equal to that of a conventional structure (a structure in which no plug electrode is used: hereinafter, the second conventional structure) in which a front electrode made of aluminum is embedded in a contact hole.

Nonetheless, in Japanese Laid-Open Patent Publication No. H06-310729, a problem arises in that since the barrier metal (part of the barrier metal excluding the part formed at the inner wall of the contact hole) on the interlayer insulating film is selectively removed by patterning, the number of processes increases such as for forming a mask for the patterning. Further, when the barrier metal on the interlayer insulating film is removed by a CMP such as in Published Japanese-Translation of PCT Application, Publication No. 2010-503224, a problem arises in that cost increases. Further, in addition to the problem of not obtaining the recovery effect for the gate threshold voltage as described above, the first conventional structure depicted in FIG. 24 has the following problem.

Figure 23:
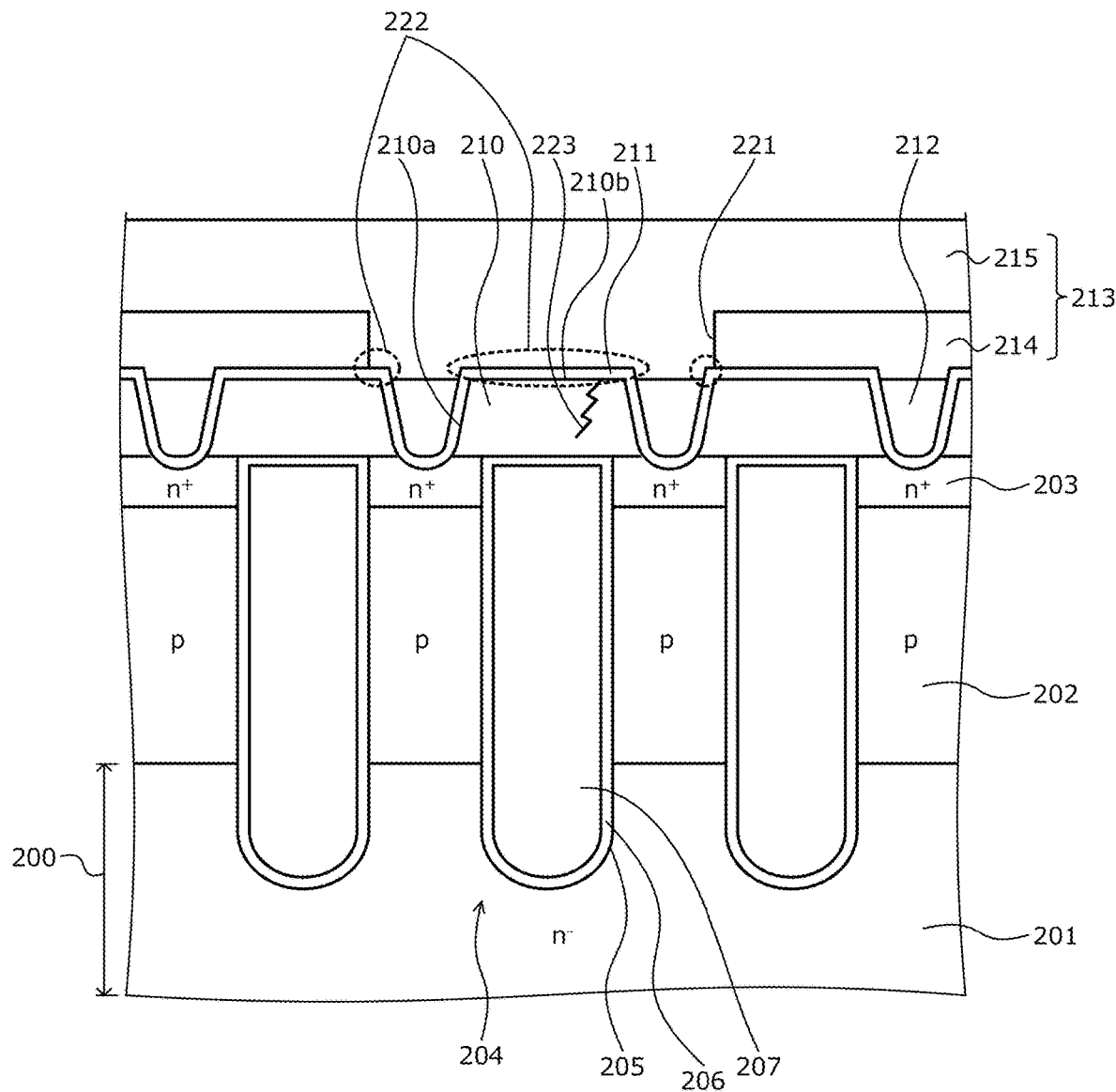
FIG. 23 is a diagram depicting a problem occurring with a first conventional structure depicted in FIG. 24.
Figure 24:
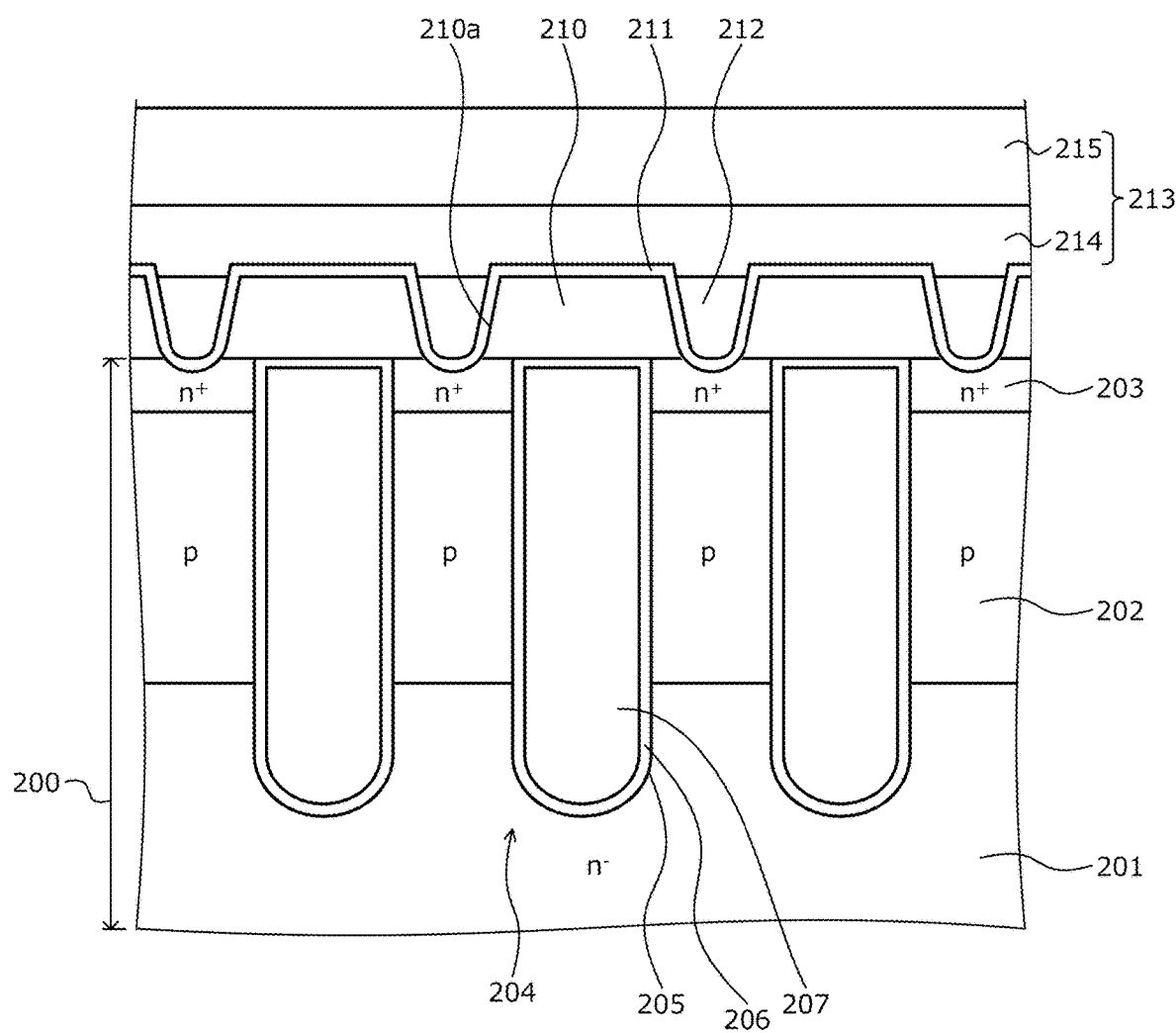
FIG. 24 is a cross-sectional view of a structure of a conventional semiconductor device.

FIG. 23 is a diagram depicting a problem occurring with the first conventional structure depicted in FIG. 24. In the first conventional structure depicted in FIG. 24, to increase the adhesiveness between the front electrode 213 and wiring, the front electrode 213 may have a stacked structure in which, for example, a nickel (Ni) film 215 having high adhesiveness with solder is stacked on an aluminum film 214. In the front electrode 213 having such a stacked structure, when a gap 221 occurs in the aluminum film 214 due to the effects of foreign matter, etc. as depicted in FIG. 23, at the location of the gap 221 in the aluminum film 214, the barrier metal 211 and the plug electrode 212 are exposed and contact the nickel film 215.

The barrier metal 211 and the nickel film 215 have high adhesion to each other and over a wide range of a surface 210b (hereinafter, top surface) of the interlayer insulating film 210, the barrier metal 211 and the nickel film 215 are adhered to each other (part encompassed by dashed line indicated by reference numeral 222). Therefore, during implementation of the semiconductor substrate (semiconductor chip) 200 or heat cycles thereafter, heat stress applied to the interlayer insulating film 210 due to temperature increase of the nickel film 215 is great, whereby a crack 223 in the interlayer insulating film 210 may be formed, the barrier metal 211 or the interlayer insulating film 210 may peel, etc. As a result, insulation by the interlayer insulating film 210 may decrease, leak current may increase, predetermined characteristics may not be obtained, etc.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
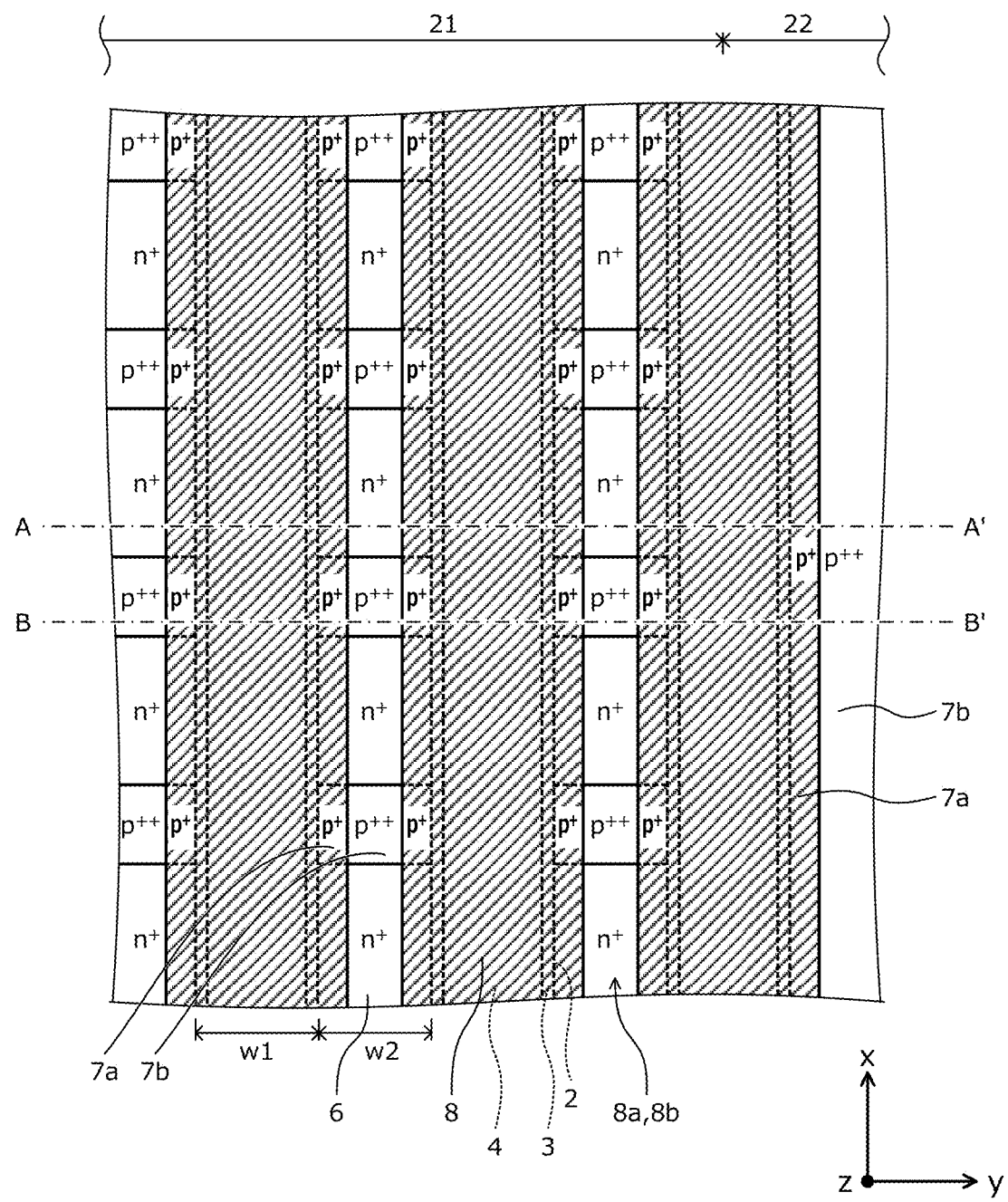
FIG. 1 is a plan view of an example of a planar layout of a semiconductor device manufactured by a method of manufacturing a semiconductor device according to a first embodiment.
Figure 2:
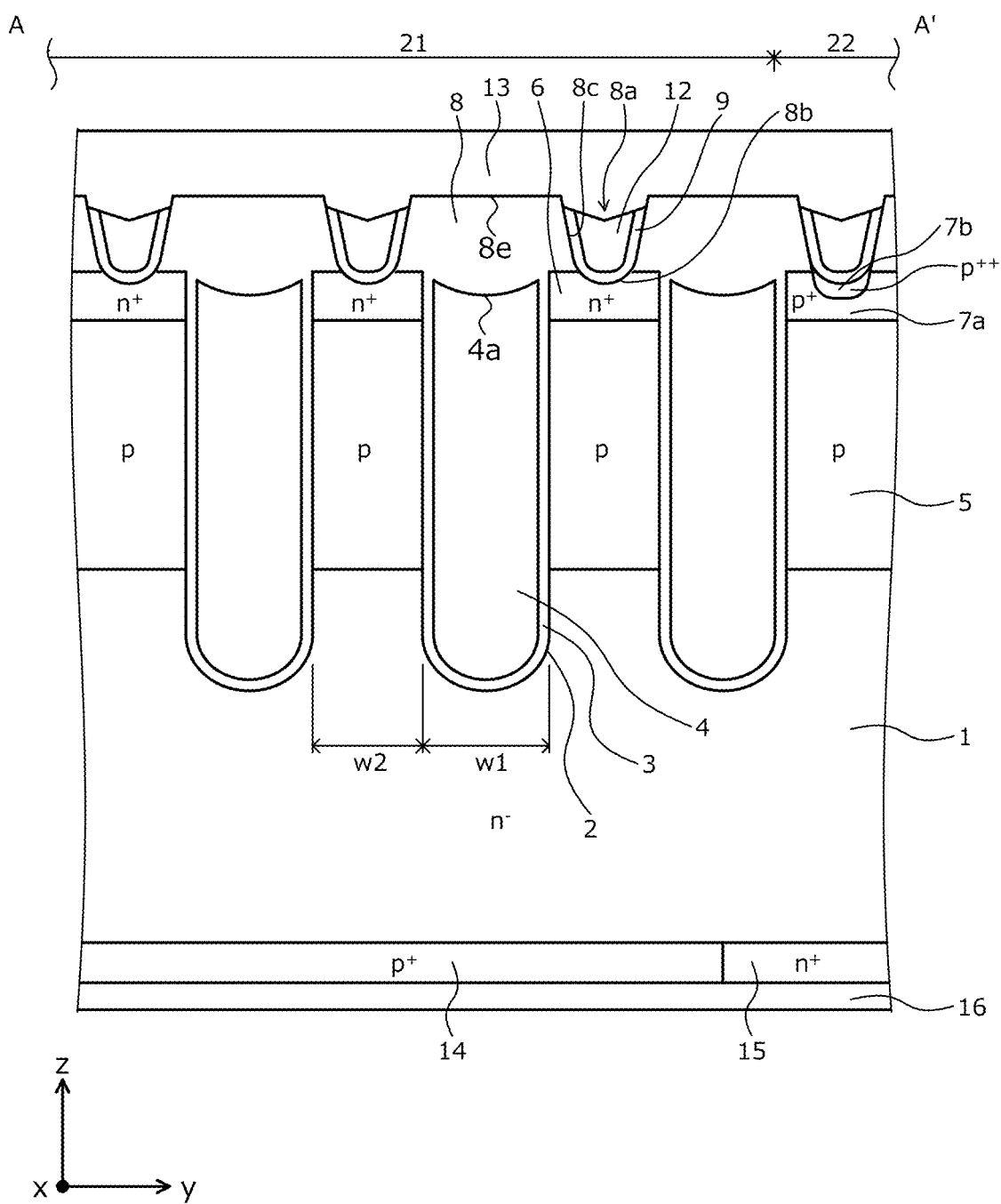
FIG. 2 is a cross-sectional view of a structure at cutting line A-A' in FIG. 1.
Figure 3:
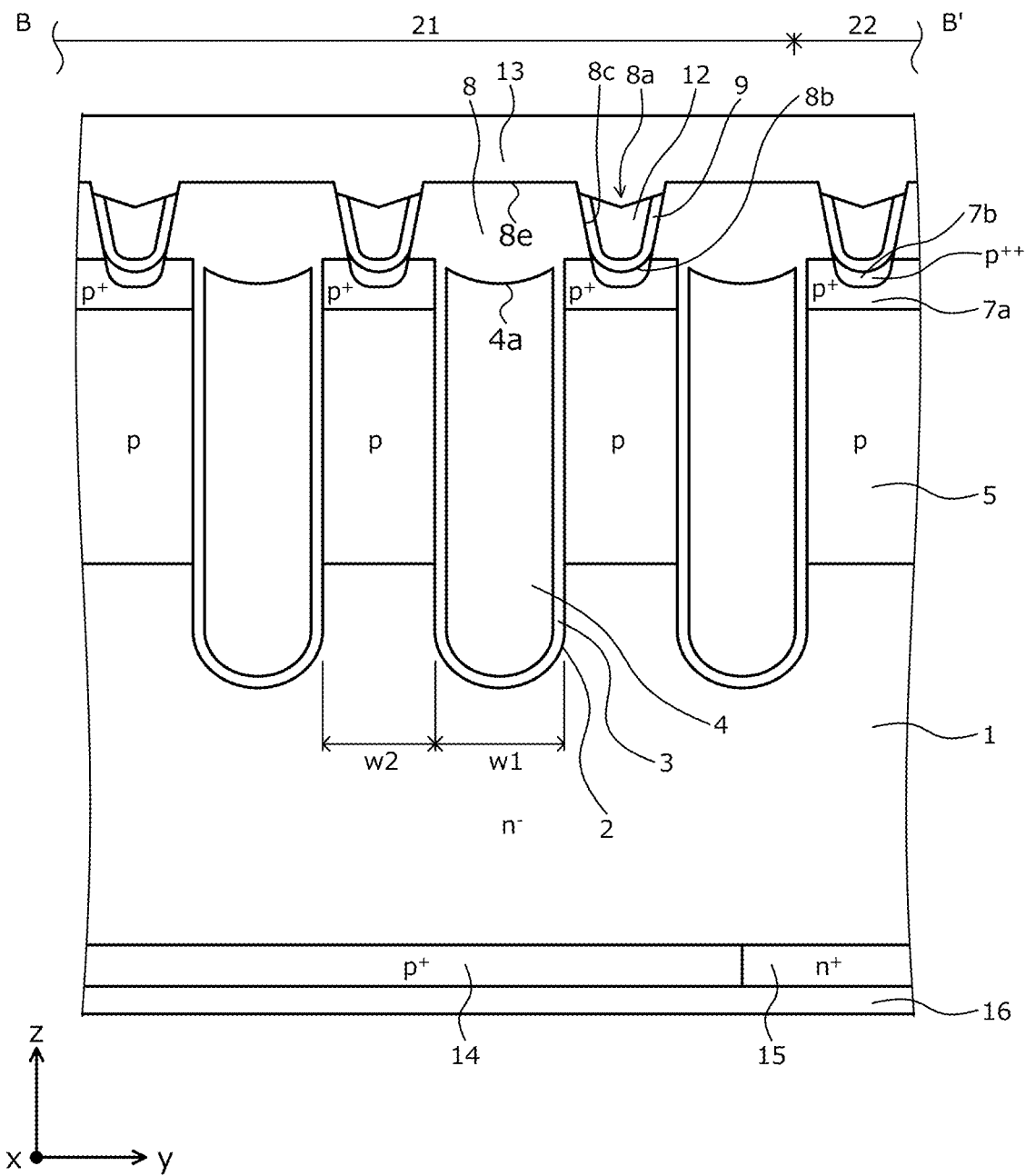
FIG. 3 is a cross-sectional view of the structure at cutting line B-B' in FIG. 1.
Figure 4:
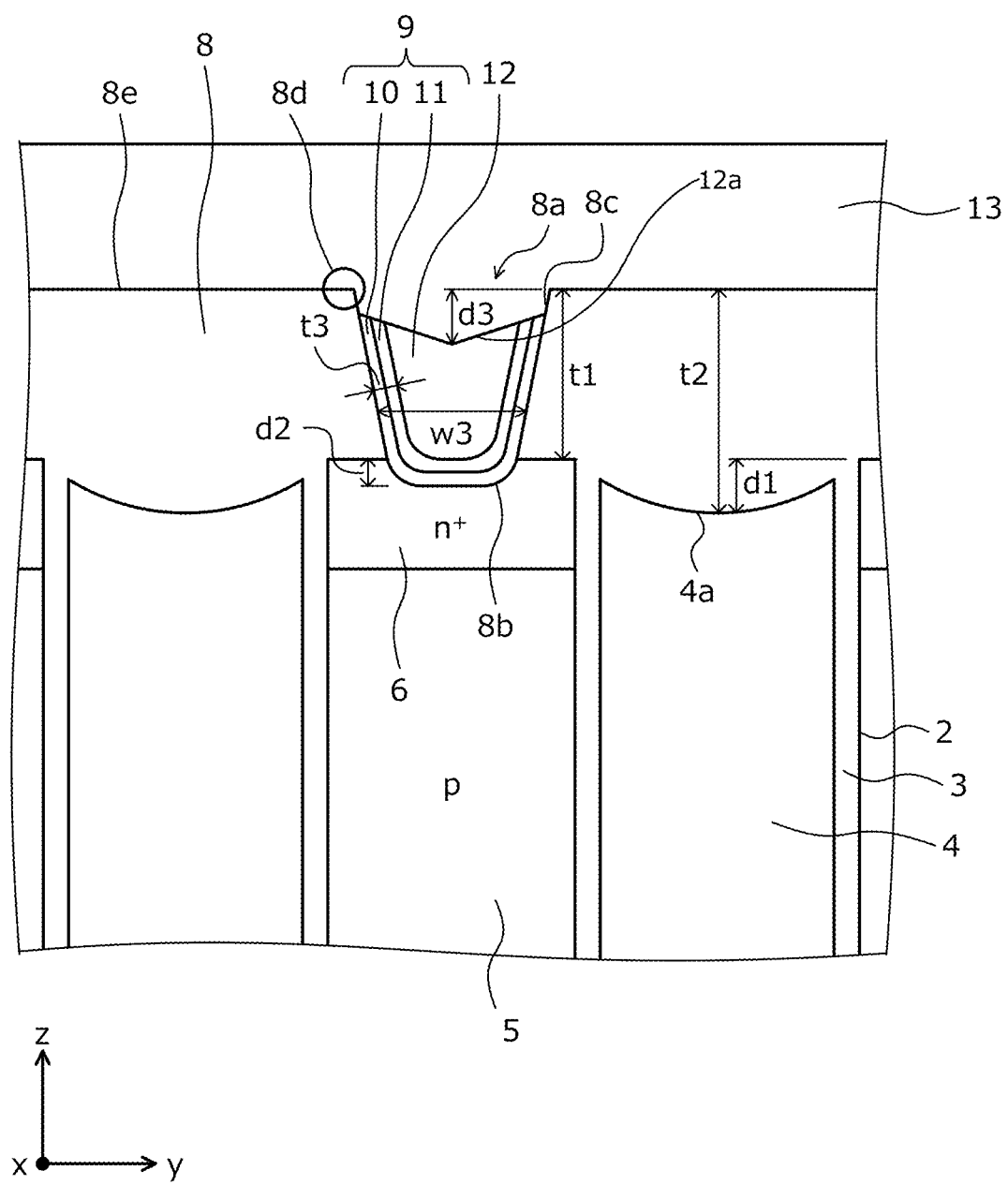
FIG. 4 is an enlarged view of a cross-section near a contact hole in FIG. 2.

A structure of a reverse conducting insulated-gate bipolar transistor (RC-IGBT) will be described as an example of a semiconductor device fabricated (manufactured) by a method of manufacturing a semiconductor device according to a first embodiment. FIG. 1 is a plan view of an example of a planar layout of the semiconductor device manufactured by the method of manufacturing the semiconductor device according to the first embodiment. FIG. 2 is a cross-sectional view of the structure at cutting line A-A' in FIG. 1. FIG. 3 is a cross-sectional view of the structure at cutting line B-B' in FIG. 1. FIG. 4 is an enlarged view of a cross-section near a contact hole in FIG. 2. Although no enlarged view near a contact hole in FIG. 3 is depicted, an enlarged view near a contact hole in FIG. 3 would depict a state in which a $p^+$-type contact region 7a and a $p^{++}$-type plug region 7b are disposed instead of an $n^+$-type emitter region 6 in FIG. 2. In FIG. 1, an interlayer insulating film 8 is indicated by hatching while a barrier metal (metal film) 9, a plug electrode (metal layer) 12 and a front electrode (first electrode) 13 are not depicted.

The semiconductor device according to the first embodiment depicted in FIGS. 1 to 4 is a RC-IGBT that includes a trench-gate IGBT (first semiconductor element) and a free wheeling diode (FWD) (second semiconductor element) on a single semiconductor substrate (semiconductor chip). A trench 2 is provided at a predetermined depth from a front surface of a semiconductor substrate of an $n^-$-type and constituting an $n^-$-type drift layer 1. The trench 2 is provided, for example, in plural in a striped planar layout an IGBT region (first formation region) 21 in which an IGBT element structure is provided and in a FWD region (second formation region) 22 in which a FWD element structure is provided. A direction (hereinafter, first direction) x along which the trenches 2 extend is orthogonal to a direction (hereinafter, second direction) y along which the IGBT region 21 and the FWD region 22 are arranged.

A width (hereinafter, simply width) w1 of the trenches 2 along the second direction y is reduced, whereby a unit cell (functional unit of an element) of the IGBT including a single trench 2 may be reduced in size. Trench pitch (an interval at which the trench 2 is disposed) is reduced, whereby a unit cell of the FWD provided in a semiconductor part (mesa part) between a pair of the trenches 2 that are adjacent may be reduced in size. The width w1 and the trench pitch of the trenches 2 are reduced, enabling the semiconductor chip to be reduced in size. The trench pitch may be the same for the IGBT region 21 and for the FWD region 22. When the semiconductor chip is to be reduced in size, for example, a width (width (hereinafter, mesa width) between adjacent trenches 2) w2 of the mesa part is narrower than the width w1 of the trenches 2 (w2<w1).

In each of the trenches 2, a gate insulating film 3 is provided along an inner wall of the trench 2, and a gate electrode 4 is provided on the gate insulating film 3. The trench 2, the gate insulating film 3, and the gate electrode 4 constitute a MOS gate. In the IGBT region 21, the gate electrode 4 may be embedded in the trench 2 to an extent that the gate electrode 4 opposes the $n^+$-type emitter region 6 described hereinafter, across the gate insulating film 3 provided at a side wall of the trench 2. Therefore, a top surface (surface on a front electrode 13 side described hereinafter) of the gate electrode 4 may be slightly recessed (hereinafter, a recess 4a of the top surface of the gate electrode 4) from a substrate front surface toward a collector side. In other words, the top surface of the gate electrode 4 may be positioned in the trench 2.

A p-type base region (first semiconductor region) 5 is provided in a mesa part (semiconductor part between adjacent trenches 2), at a depth shallower than a depth of the trench 2. A width of the p-type base region 5 is equal to the mesa width w2 and the p-type base region 5 is exposed at the side walls of the trenches 2 on each side of the p-type base region 5. The p-type base region 5 functions as a p-type anode region in the FWD region 22. In the IGBT region 21, the $n^+$-type emitter region (second semiconductor region) 6 and the $p^+$-type contact region 7a are each selectively provided in the p-type base region 5 so as to be exposed at the substrate front surface. The $n^+$-type emitter region 6 and the $p^+$-type contact region 7a (the $p^{++}$-type plug region 7b described hereinafter), for example, are provided in contact with each other in a planar layout alternating each other repeatedly along the first direction x.

The $n^+$-type emitter regions 6 provided in different mesa parts, for example, oppose each other across the trench 2, along the second direction y. The $p^+$-type contact regions 7a provided in different mesa parts, for example, oppose each other across the trench 2, along the second direction y. Widths of the $n^+$-type emitter region 6 and the $p^+$-type contact region 7a are equal to the mesa width w2. The $n^+$-type emitter region 6 and the $p^+$-type contact region 7a are exposed at the side walls of the trenches 2 on each side of the $n^+$-type emitter region 6 and the $p^+$-type contact region 7a. The $p^{++}$-type plug region 7b is selectively provided in the $p^+$-type contact region 7a so as to be exposed at the substrate front surface. The $p^{++}$-type plug region 7b is in contact with the $n^+$-type emitter regions 6 adjacent thereto along the first direction x. A width of the $p^{++}$-type plug region 7b is substantially equal to a width w3 of a contact hole 8a described hereinafter. The $p^{++}$-type plug region 7b is not exposed at the side walls of the trenches 2.

The interlayer insulating film 8 is provided on the substrate front surface, spanning the IGBT region 21 and the FWD region 22 so as to cover the MOS gate. The interlayer insulating film 8, for example, is a silicon oxide ($SiO_2$) film containing boron (B) and phosphorus (P) such as a borophosphosilicate glass (BPSG), and has a boron concentration and a phosphorus concentration higher than those of an interlayer insulating film of an ordinary composition. In particular, in an interlayer insulating film of an ordinary composition, the boron concentration is about 2.0 wt % to 2.4 wt % and the phosphorus concentration is about 1.5 wt % to 2.5 wt %. The boron concentration of the interlayer insulating film 8 of the present invention, for example, is in a range from about 2.6 wt % to 3.8 wt %; and the phosphorus concentration, for example, is in a range from about 3.6 wt % to 4.4 wt %.

For example, the narrower the mesa width w2 is, the smaller the width (width of the mesa part) between adjacent gate electrodes 4 is and the recess 4a of the top surface of the gate electrode 4 becomes continuous along the second direction y, whereby unevenness of the substrate front surface increases. In this case, in an interlayer insulating film of an ordinary composition, even after reflow, unevenness corresponding to the unevenness of the substrate front surface remains at the surface of the interlayer insulating film (refer to FIG. 19). On the other hand, in the present invention, the boron concentration and the phosphorus concentration of the interlayer insulating film 8 satisfies the described conditions, whereby fluidity of the interlayer insulating film 8 during deposition (formation) of the interlayer insulating film 8, or during heat treatment (reflow) for planarization of the surface of the interlayer insulating film 8 may be enhanced. As a result, even in a microstructure in which the mesa width w2 has been reduced, a surface (a top surface 8e described hereinafter) of the interlayer insulating film 8 becomes substantially flat by reflow.

While the thickness of the interlayer insulating film 8 may be as thick as possible since insulation and separation effects of the interlayer insulating film 8 may be increased with increased thickness of the interlayer insulating film 8, at least a thickness t1 of a part of the interlayer insulating film 8, the part on the mesa part, may be the width w3 of the contact hole 8a or greater (t1≥w3). A reason for this is as follows. The greater a ratio (=w3/t1) of the width w3 of the contact hole 8a to a depth (i.e., the thickness t1 of the part of the interlayer insulating film 8 on the mesa part) of the contact hole 8a exceeds 1, the contact hole 8a becomes more difficult to fill with the plug electrode 12. Therefore, the plug electrode 12 has to be deposited (formed) thickly, however, in this case, deposition of the plug electrode 12 and etch back of the plug electrode 12 described hereinafter takes more time. Further, even when the plug electrode 12 is deposited thickly, the contact hole 8a may not be filled with the plug electrode 12. As described above, the top surface 8e of the interlayer insulating film 8 becomes substantially flat irrespective of the recess 4a of the top surface of the gate electrode 4 and therefore, a thickness t2 of a thickest part of the interlayer insulating film 8 on the gate electrode 4 is a sum (t2=d1+t1) of a depth d1 from the substrate front surface to a bottom of the recess 4a of the top surface of the gate electrode 4 and the thickness t1 of the part of the interlayer insulating film 8 on the mesa part.

The contact hole 8a is provided penetrating the interlayer insulating film 8 in a depth direction z. The width w3 of the contact hole 8a is narrower than the mesa width w2 (w3<w2). For example, when the mesa width w2 is about 1 μm, the width w3 of the contact hole 8a is about 0.6 μm or less, whereby a microstructure having a narrow trench pitch is formed. The width w3 of the contact hole 8a is a width of a lower end side (mesa part side) of the contact hole 8a, and a width of a contact between a semiconductor part and the barrier metal 9 described hereinafter. A width of an upper end side (the front electrode 13 side) of the contact hole 8a may be in a range not detrimental to an embedding property of the plug electrode 12 and may be wider than the width of the lower end side of the contact hole 8a.

The $n^+$-type emitter region 6 and the $p^{++}$-type plug region 7b disposed in a planar layout to repeatedly alternate along the first direction x are exposed in the contact hole 8a. A semiconductor part (mesa part) is slightly removed during formation of the contact hole 8a, whereby parts of the $n^+$-type emitter region 6 and the $p^{++}$-type plug region 7b exposed in the contact hole 8a are slightly recessed toward the collector side and are further on the collector side than is an interface of the interlayer insulating film 8 and a semiconductor part (hereinafter, the recess is referred to as a groove (first groove) 8b of the mesa part). A width of the groove 8b of the mesa part, for example, is equal to the width w3 of the contact hole 8a and an inner wall of the groove 8b of the mesa part is continuous with a side wall (a side surface 8c of the interlayer insulating film 8) of the contact hole 8a. Configuration may be such that an upper end (end part on the front electrode 13 side) corner part 8d of the side surface 8c of the interlayer insulating film 8 is not curved (rounded). A reason for this is that the width of the upper end side of the contact hole 8a becomes too wide, whereby as described above, formation of the plug electrode 12 takes time and the plug electrode 12 may not be embedded in the contact hole 8a.

In the contact hole 8a and in the groove 8b of the mesa part, the barrier metal 9 is provided along inner walls of the groove 8b of the mesa part and the contact hole 8a, and the plug electrode 12 is provided on the barrier metal 9. The barrier metal 9 and the plug electrode 12 function as the front electrode 13, an emitter electrode, and an anode electrode. The barrier metal 9 is provided only at the side surface 8c of the interlayer insulating film 8 and the inner wall of the groove 8b of the mesa part, and does not extend onto the upper end corner part 8d of the side surface 8c or the top surface 8e of the interlayer insulating film 8. In other words, the upper end corner part 8d of the side surface 8c and the top surface 8e of the interlayer insulating film 8 are in contact with the front electrode 13; and the barrier metal 9 does not oppose across the interlayer insulating film 8 in the depth direction z, a part (the gate electrode 4, or parts of the mesa part along the side walls of the trenches 2) covered by the interlayer insulating film 8.

The barrier metal 9, for example, may have a 2-layer structure in which first and second metal films 10, 11 are sequentially stacked. The first metal film 10, for example, is a titanium (Ti) film having high adhesiveness with silicon (Si) and converted into a silicide (titanium silicide (TiSi)), forming an ohmic contact with the $n^+$-type emitter region 6 and the $p^{++}$-type plug region 7b. The second metal film 11, for example, is a titanium nitride (TiN) film. A thickness (total thickness of the first and the second metal films 10, 11) t3 of the barrier metal 9, for example, is substantially equal to a depth d2 of the groove 8b of the mesa part. The barrier metal 9 is embedded in the groove 8b of the mesa part.

As a material of the plug electrode 12, for example, tungsten (W) having a high embedding property is used. A top surface of the plug electrode 12 may be at a height position substantially equal to that of the top surface 8e of the interlayer insulating film 8, or may be slightly recessed (hereinafter, a recess 12a of the top surface of the plug electrode 12 toward and further on the collector side than is the top surface 8e of the interlayer insulating film 8, depending on the processing time of etching for forming the plug electrode 12. A depth d3 of the recess 12a of the top surface of the plug electrode 12 may be shallow so that a step formed with the top surface 8e of the interlayer insulating film 8 becomes small and, for example, the depth d3 is in a range from about 0 μm to 3 μm. Further, the plug electrode 12 does not extend to the upper end corner part 8d of the side surface 8c of the interlayer insulating film 8.

At the surfaces of the plug electrode 12 and the interlayer insulating film 8, the front electrode 13 having, for example, aluminum-silicon (Al—Si) as a material is provided so as to be embedded in the recess 12a of the top surface of the plug electrode 12. In the IGBT region 21, the front electrode 13 is electrically connected with the $n^+$-type emitter region 6 and the $p^{++}$-type plug region 7b via the plug electrode 12 and the barrier metal 9, and functions as an emitter electrode. Further, in the FWD region 22, the front electrode 13 is electrically connected with the $p^{++}$-type plug region 7b via the plug electrode 12 and the barrier metal 9, and functions as an anode electrode.

In a surface layer of a rear surface of the semiconductor substrate, a $p^+$-type collector region (third semiconductor region) 14 is provided in the IGBT region 21; and an $n^+$-type cathode region (fourth semiconductor region) 15 is provided in the FWD region 22. A field stopper layer (not depicted) may be provided in the surface layer of the rear surface of the semiconductor substrate, at a position deeper than that of the $p^+$-type collector region 14 and the $n^+$-type cathode region 15, the field stopper layer suppressing the spread of a depletion layer that spreads from a pn junction between the p-type base region 5 and the $n^-$-type drift layer 1 during an OFF state. A rear electrode (second electrode) 16 is provided at the rear surface of the semiconductor substrate overall and is in contact with the $p^+$-type collector region 14 and the $n^+$-type cathode region 15. The rear electrode 16 is in contact with the $p^+$-type collector region 14 and functions as a collector electrode, and is in contact with the $n^+$-type cathode region 15 and functions as a cathode electrode.

Figure 5A:
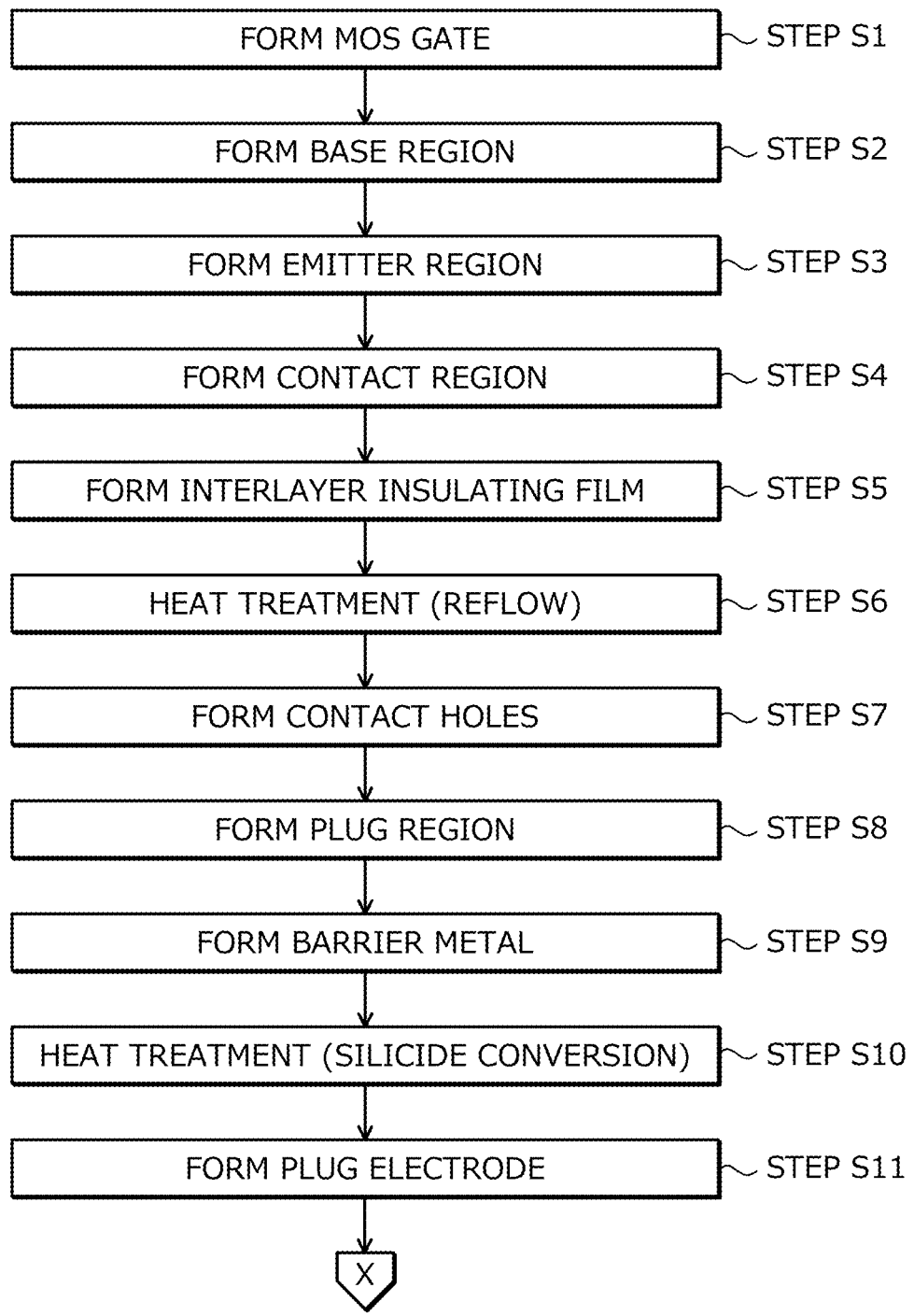
FIG. 5A is a flowchart depicting an outline of the method of manufacturing the semiconductor device according to the first embodiment.
Figure 5B:
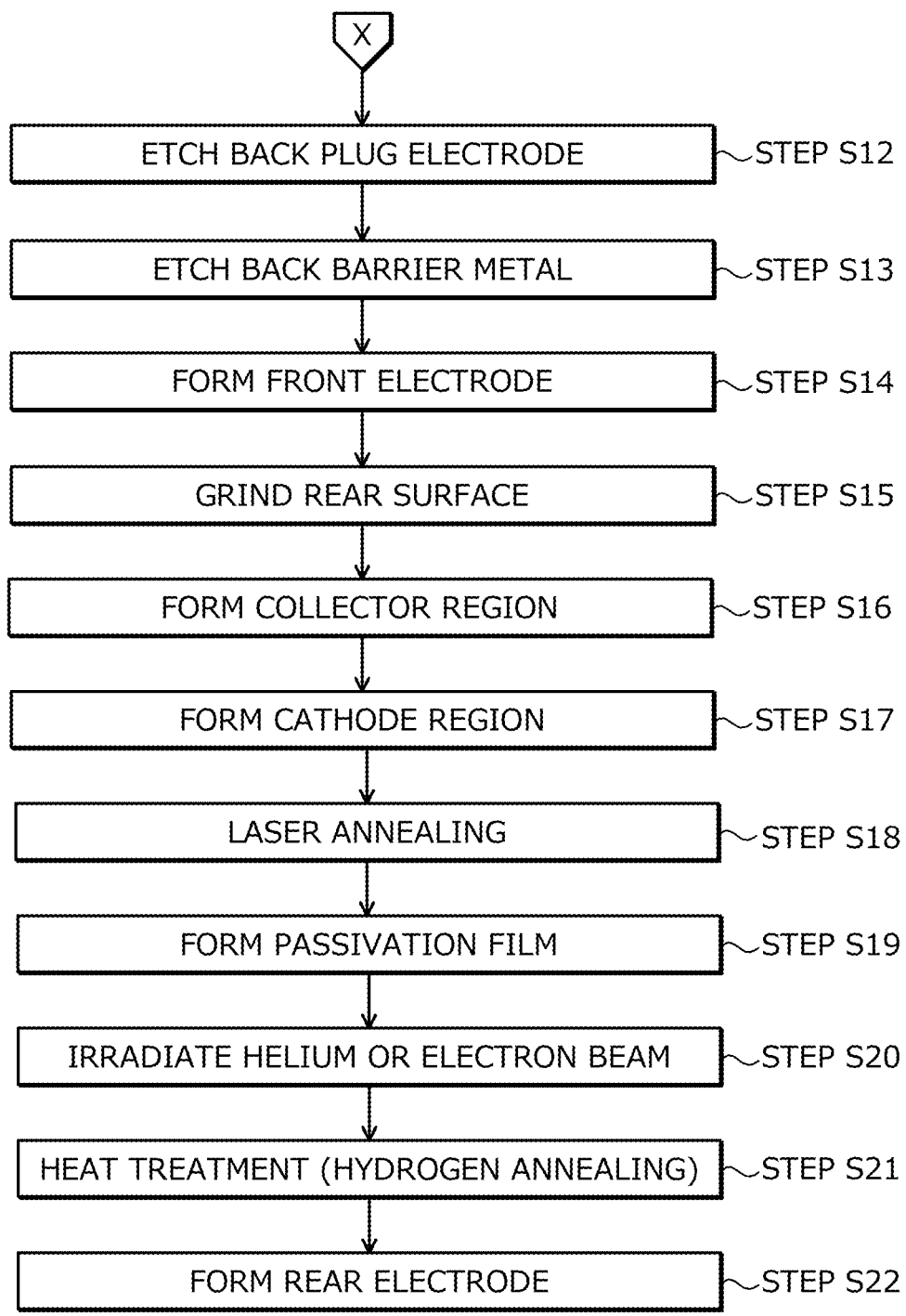
FIG. 5B is a flowchart depicting an outline of the method of manufacturing the semiconductor device according to the first embodiment.
Figure 6:
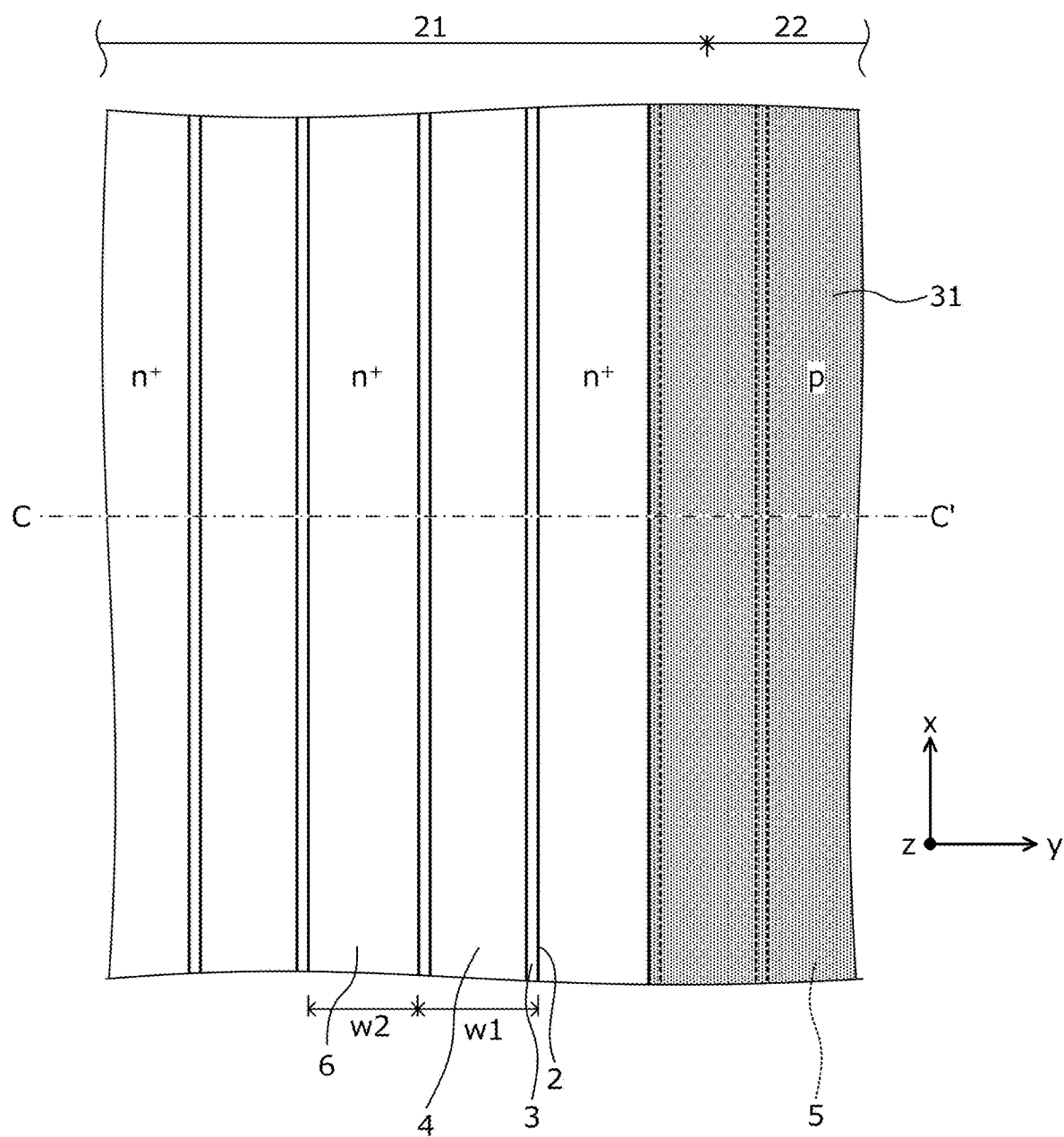
FIG. 6 is a plan view of the semiconductor device according to the first embodiment.
Figure 7:
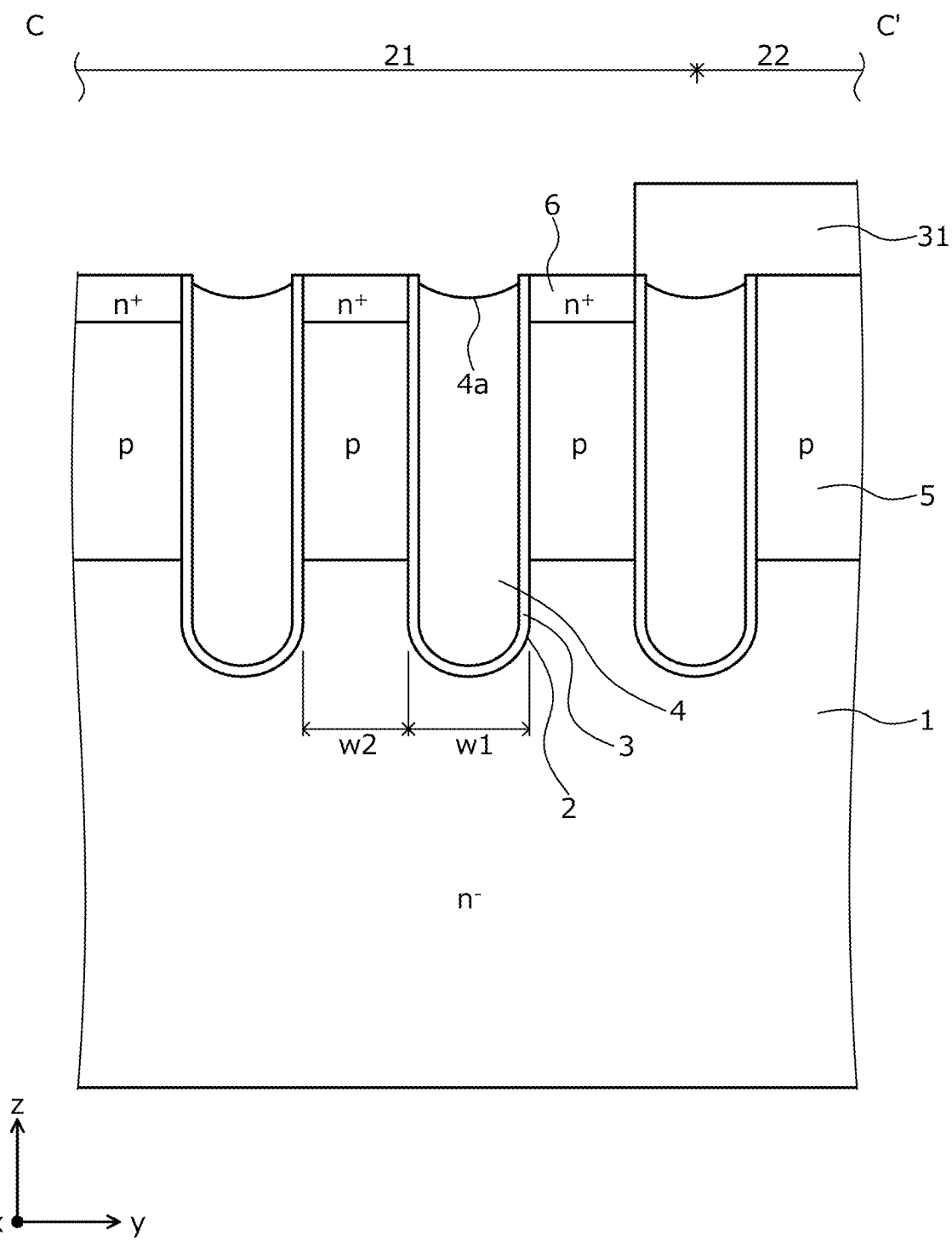
FIG. 7 is a cross-sectional view of the semiconductor device according to the first embodiment during manufacture.
Figure 8:
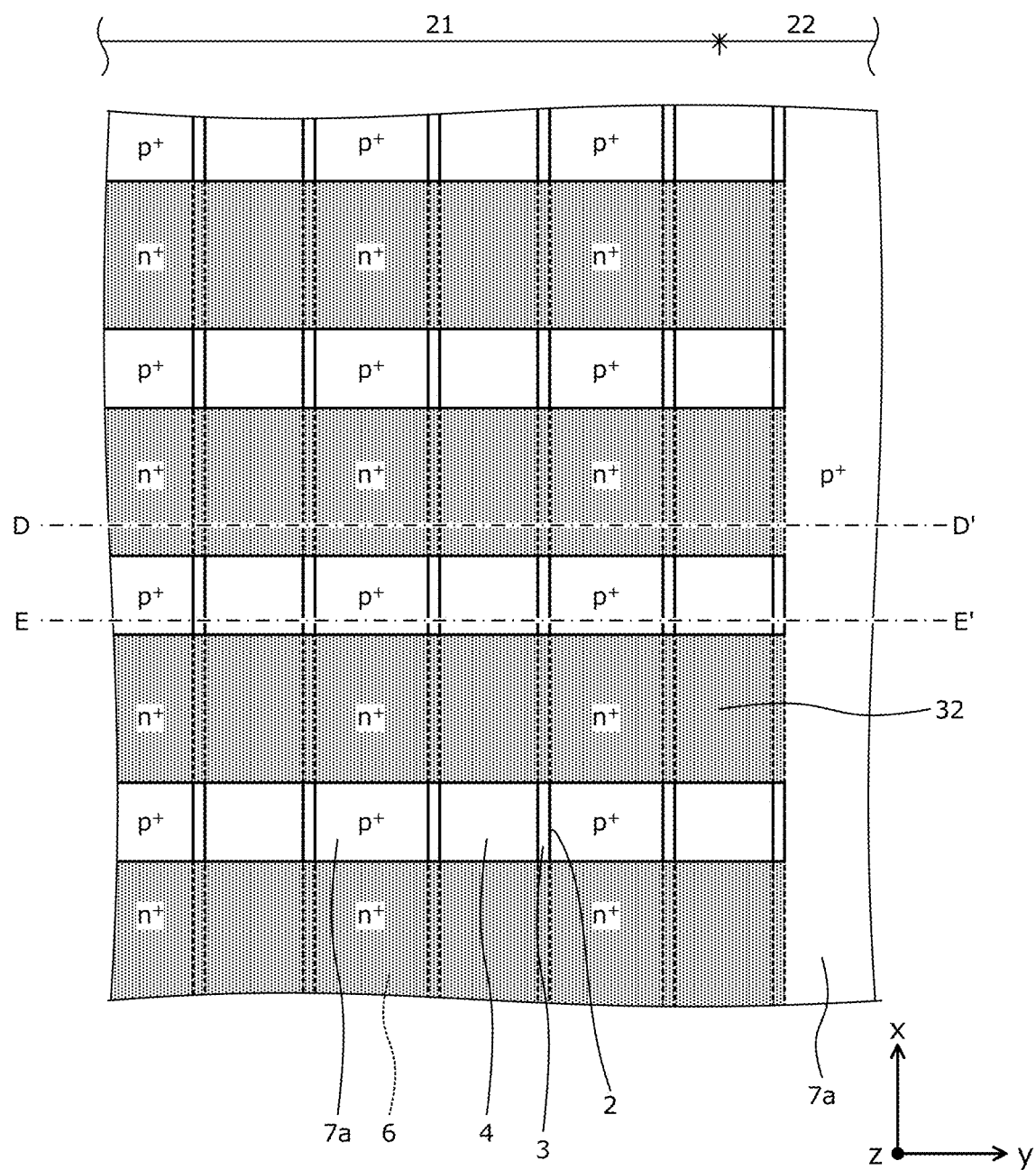
FIG. 8 is a plan view of the semiconductor device according to the first embodiment during manufacture.
Figure 9A:
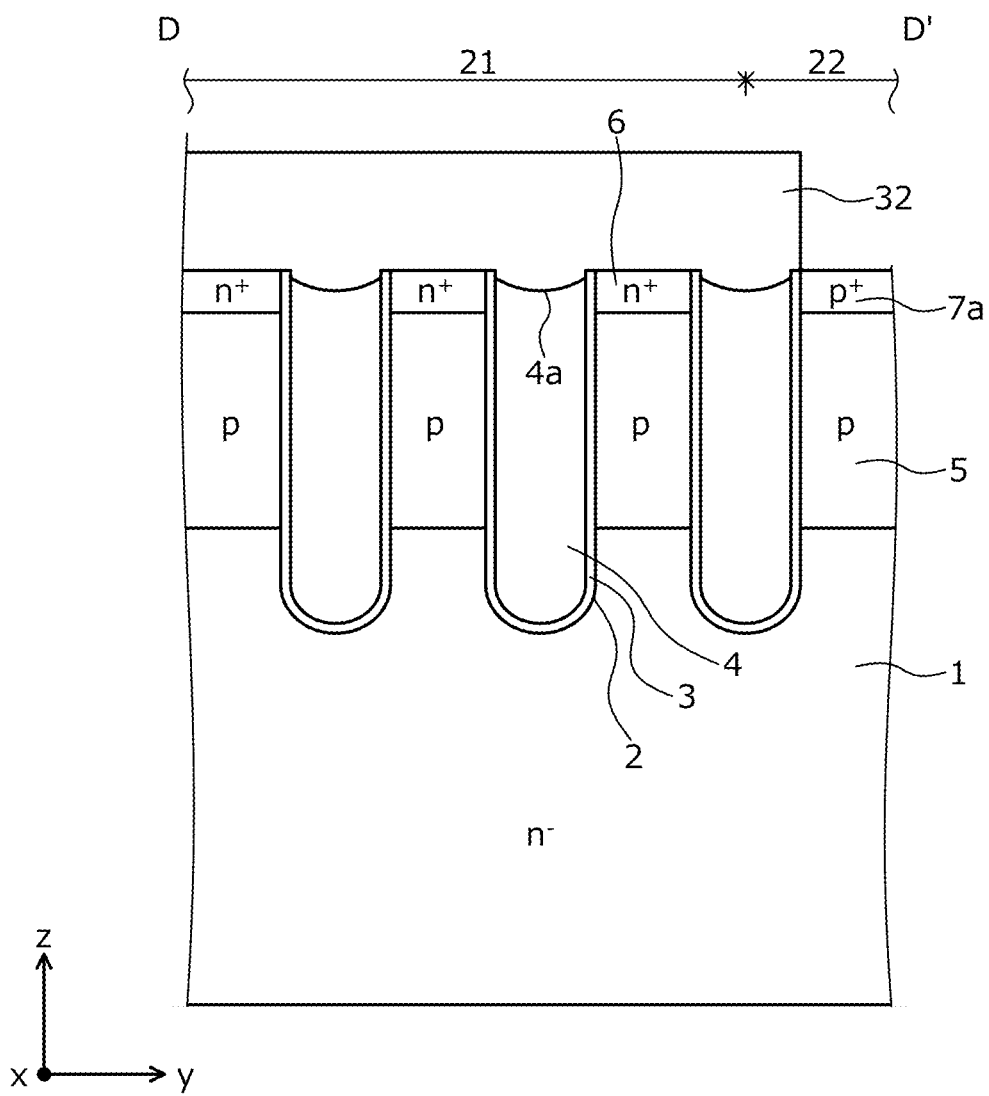
FIG. 9A is a cross-sectional view of the semiconductor device according to the first embodiment during manufacture.
Figure 9B:
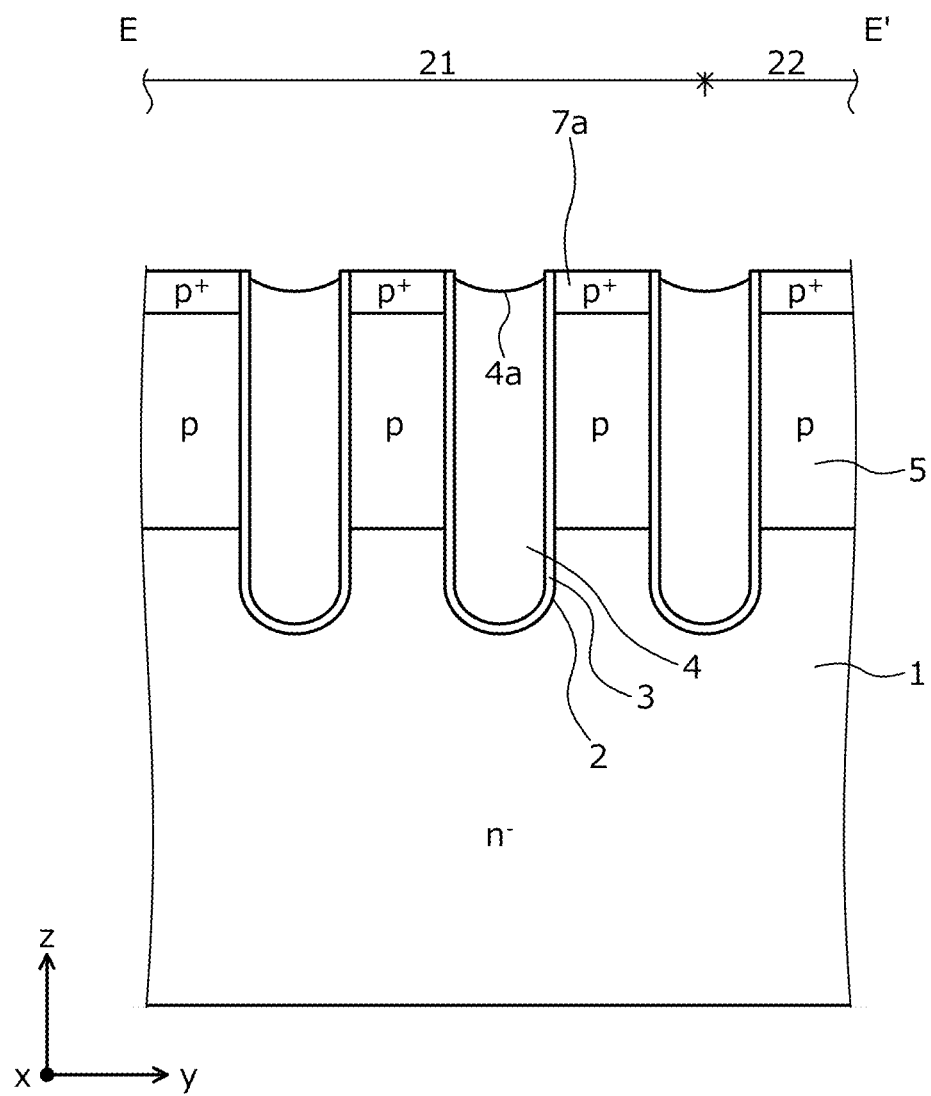
FIG. 9B is a cross-sectional view of the semiconductor device according to the first embodiment during manufacture.
Figure 10:
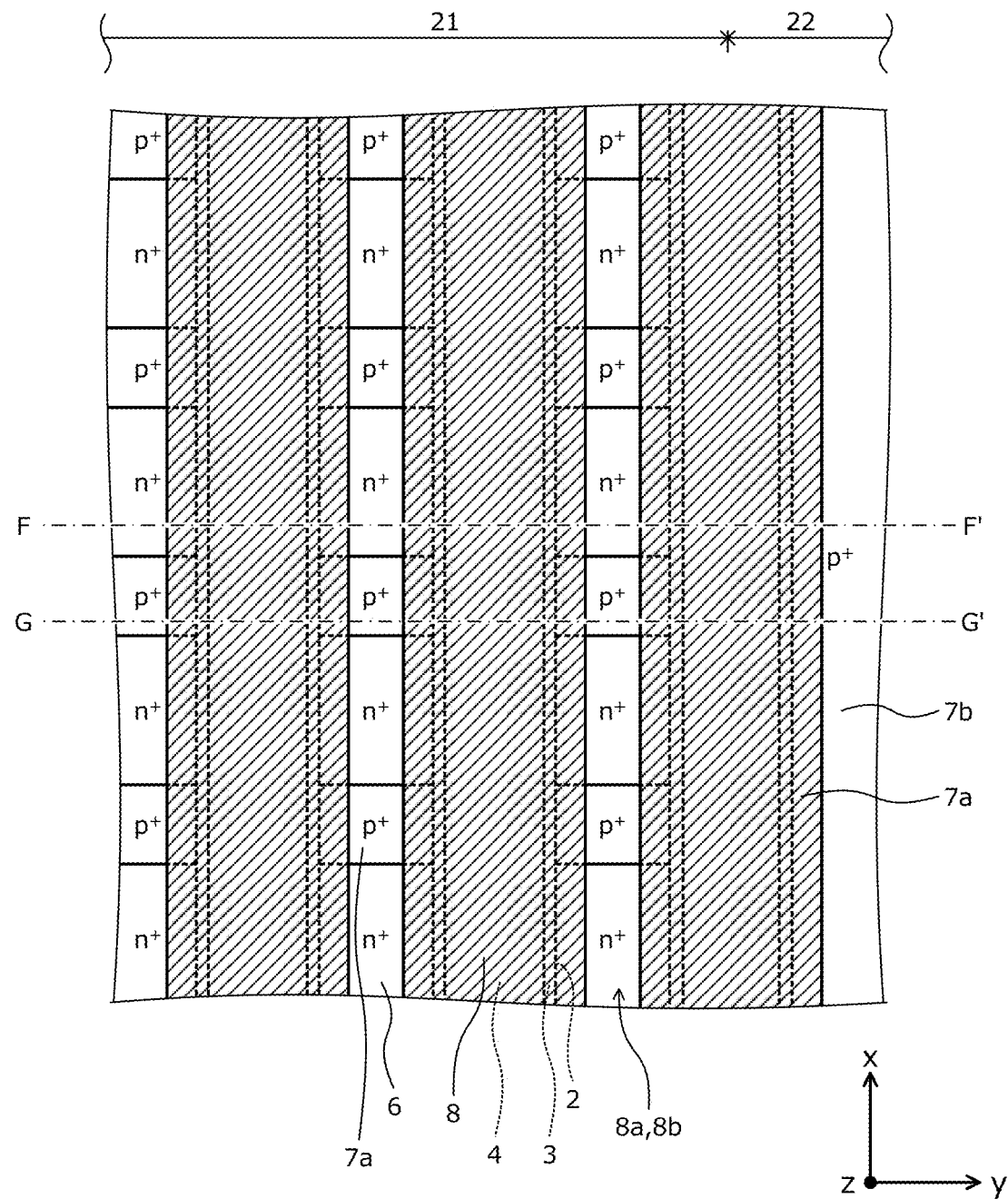
FIG. 10 is a plan view of the semiconductor device according to the first embodiment during manufacture.
Figure 11A:
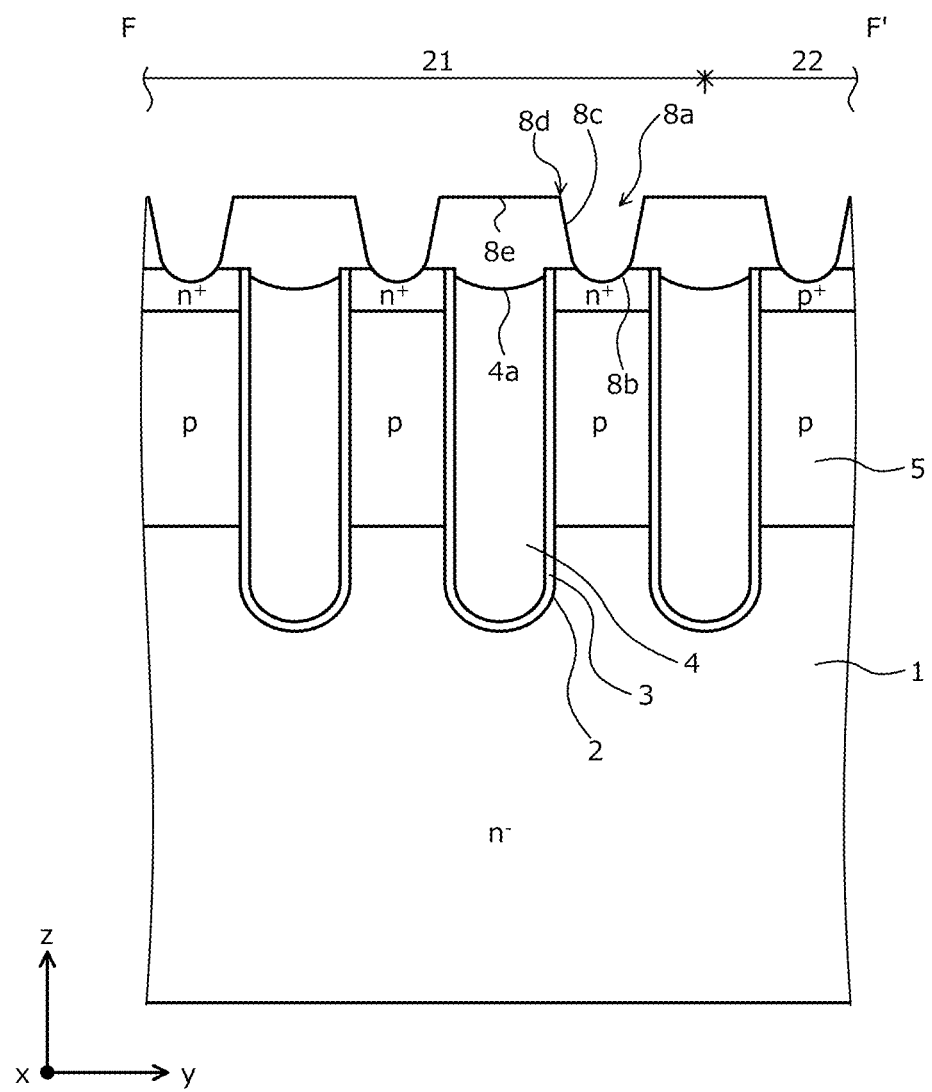
FIG. 11A is a cross-sectional view of the semiconductor device according to the first embodiment during manufacture.
Figure 11B:
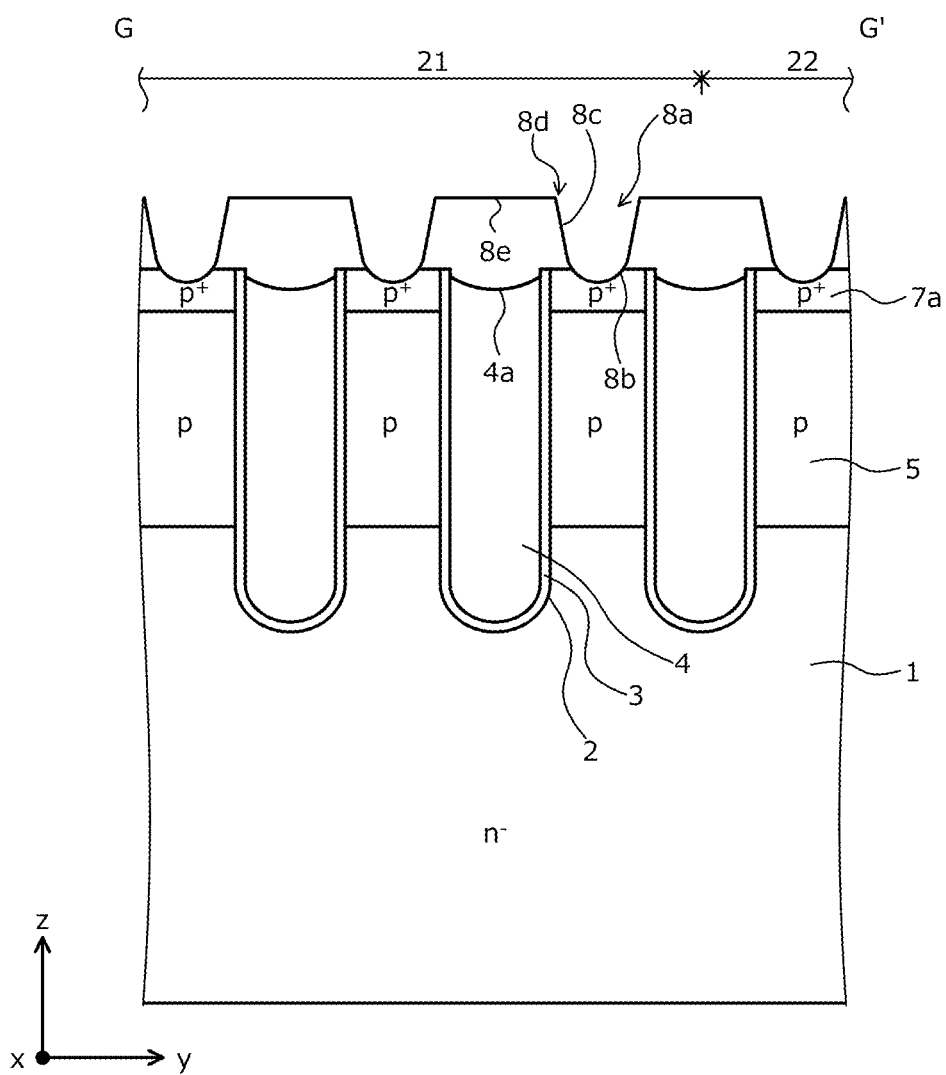
FIG. 11B is a cross-sectional view of the semiconductor device according to the first embodiment during manufacture.

A method of manufacturing the semiconductor device according to the first embodiment will be described. FIGS. 5A and 5B are flowcharts depicting an outline of the method of manufacturing the semiconductor device according to the first embodiment. FIGS. 6, 8, and 10 are plan views of the semiconductor device according to the first embodiment. FIGS. 7, 9A, 9B, 11A, 11B, 12A, 12B, 13A, 13B, 14A, 14B, 15A, 15B, 16A, 16B, 17A, and 17B are cross-sectional views of the semiconductor device according to the first embodiment during manufacture. FIG. 7 depicts a cross-sectional view of the structure at cutting line C-C' in FIG. 6. FIG. 9A depicts a cross-sectional view of the structure at cutting line D-D' in FIG. 8. FIG. 9B depicts a cross-sectional view of the structure at cutting line E-E in FIG. 8. FIG. 11A depicts a cross-sectional view of the structure at cutting line F-F' in FIG. 10. FIG. 11B depicts a cross-sectional view of the structure at cutting line G-G' in FIG. 10. FIGS. 12A to 17A depict cross-sections parallel to the second direction y and through the $n^+$-type emitter region 6. FIGS. 12B to 17B depict cross-sections parallel to the second direction y and through the $p^+$-type contact region 7a.

First, the trench 2, the gate insulating film 3 and the gate electrode 4 are sequentially formed by an ordinary method on a front surface side of a semiconductor substrate (semiconductor wafer) of an $n^-$-type and constituting the $n^-$-type drift layer 1, thereby forming a MOS gate in a striped shape extending along the first direction x (step S1). At this time, the trench pitch, for example, is determined so that the mesa width w2 is narrower than the width w1 of the trenches 2 to reduce the size of the semiconductor chip. Further, the gate insulating film 3, for example, is formed by thermal oxidation to extend from the inner wall of the trench 2 to the semiconductor part (mesa part) surface between adjacent trenches 2, however, the part of the gate insulating film 3 formed on the surface of the mesa part is removed before formation of the interlayer insulating film 8 described hereinafter. FIG. 6 depicts a state in which the part of the gate insulating film 3 formed on the surface of the mesa part has been removed. Further, the gate electrode 4 is formed by, for example, depositing (forming) a poly-silicon layer on the substrate front surface so as to be embedded in the trenches 2 and etching the poly-silicon layer so that the poly-silicon layer remains in the trenches 2. Therefore, in the top surface of the gate electrode 4, the recess 4a is formed at the predetermined depth d1 from the substrate front surface corresponding to the processing time of the etching of the poly-silicon layer.

Next, at the substrate front surface overall, for example, a p-type impurity such as boron (B) is ion implanted, forming the p-type base region 5 in the surface layer of the substrate front surface at a depth shallower than that of the trench 2, the p-type base region 5 spanning the IGBT region 21 and the FWD region 22 (step S2). At step S2, the gate electrodes 4 function as a mask, whereby the p-type base region 5 is formed at a predetermined depth in all of the mesa parts of the IGBT region 21 and the FWD region 22. Next, a resist mask 31 (hatched part in FIG. 6) having openings at parts corresponding to a formation region of the $n^+$-type emitter region 6 is formed. For example, the resist mask 31 covering the FWD region 22 and opened at the IGBT region 21 overall is formed. Next, the resist mask 31 and the gate electrodes 4 are used as a mask and, for example, an n-type impurity such as arsenic (As) is ion implanted, forming the $n^+$-type emitter region 6 in the surface layer of the p-type base regions 5 in the IGBT region 21 (step S3). The ion implantation at step S3 may be performed with a dose amount of $5 \times 10^{15}/cm^2$ and acceleration energy of 120 keV. The state up to here is depicted in FIGS. 6 and 7. Next, the resist mask 31 used in the formation of the $n^+$-type emitter region 6 is removed.

Next, a resist mask 32 (hatched part in FIG. 8) having openings at parts corresponding to a formation region of the $p^+$-type contact region 7a is formed. For example, in the IGBT region 21, a resist mask 32 is formed opened at the FWD region 22 overall and has openings in a striped shape extending along the second direction y. Next, the resist mask 32 and the gate electrodes 4 are used as a mask and, for example, a p-type impurity such as boron (B) is ion implanted, forming the $p^+$-type contact region 7a in the surface layer of the $n^+$-type emitter regions 6 in the IGBT region 21. Additionally, in the FWD region 22, the $p^+$-type contact region 7a is formed in the surface layer of the p-type base regions 5 (step S4). The $p^+$-type contact region 7a is formed in a planar layout in which the $p^+$-type contact region 7a and the $n^+$-type emitter region 6 alternate repeatedly along the first direction x in the IGBT region 21, and is formed in a striped planar layout extending along the first direction x in the FWD region 22. The ion implantation at step S4 may be performed with a dose amount of $3 \times 10^{15}/cm^2$ and acceleration energy of 120 keV. The state up to here is depicted in FIGS. 8 and 9. Next, the resist mask 32 used in the formation of the $p^+$-type contact region 7a is removed.

Next, as the interlayer insulating film 8, for example, a BPSG film satisfying the boron concentration and the phosphorus concentration conditions above is deposited (formed) on the substrate front surface so as to cover the gate electrodes 4 (step S5). Next, for example, heat treatment (reflow) at a temperature of about 950 degrees C. in a nitrogen ($N_2$) atmosphere is performed for about 20 minutes, whereby the surface of the interlayer insulating film 8 is planarized (step S6). Since the boron concentration and the phosphorus concentration of the interlayer insulating film 8 satisfy the conditions above, irrespective of unevenness of the substrate front surface due to the recess 4a of the top surface of the gate electrodes 4, the top surface 8e of the interlayer insulating film 8 becomes substantially flat by the reflow. At step S6, reflow is performed at a high temperature enabling planarization of the top surface 8e of the interlayer insulating film 8 and, for example, the temperature is in a range from about 800 degrees C. to 1000 degrees C. and may be at least 900 degrees C. Next, by photolithography and etching, the interlayer insulating film 8 is patterned and the contact holes 8a are formed, exposing the $n^+$-type emitter regions 6 and the $p^+$-type contact regions 7a (step S7). FIG. 10 depicts by hatching, the interlayer insulating film 8 after patterning.

At step S7, at the time of patterning of the interlayer insulating film 8, parts (mesa parts) of the $n^+$-type emitter regions 6 and the $p^+$-type contact regions 7a exposed in the contact holes 8a are slightly removed, forming the groove 8b in the surface of the mesa parts. As a result, a mathematical area of contact with the barrier metal 9 formed subsequently increases and therefore, reduction of contact resistance becomes possible. Alternatively, without increasing the contact resistance, a reduction in size corresponding to the amount of increase of the mathematical area of contact is possible. Further, after the formation of the contact holes 8a (process at step S7), reflow at a temperature of about 950 degrees C. for smoothing the upper end corner part 8d of the side surface 8c of the interlayer insulating film 8 is not performed. Furthermore, subsequent to the formation of the contact holes 8a, for example, heat treatment at a temperature of about 800 degrees C. or higher is not performed. As a result, the upper end corner part 8d of the side surface 8c of the interlayer insulating film 8 is maintained in a substantially angled state, whereby the flatness of the top surface 8e of the interlayer insulating film 8 is enhanced. In particular, the flatness of the top surface 8e of the interlayer insulating film 8 before the formation of the barrier metal 9 described subsequently (process at step S9 described hereinafter) is favorable, further enhancing an effect of the present invention. The state up to here is depicted in FIGS. 10 and 11.

Figure 12A:
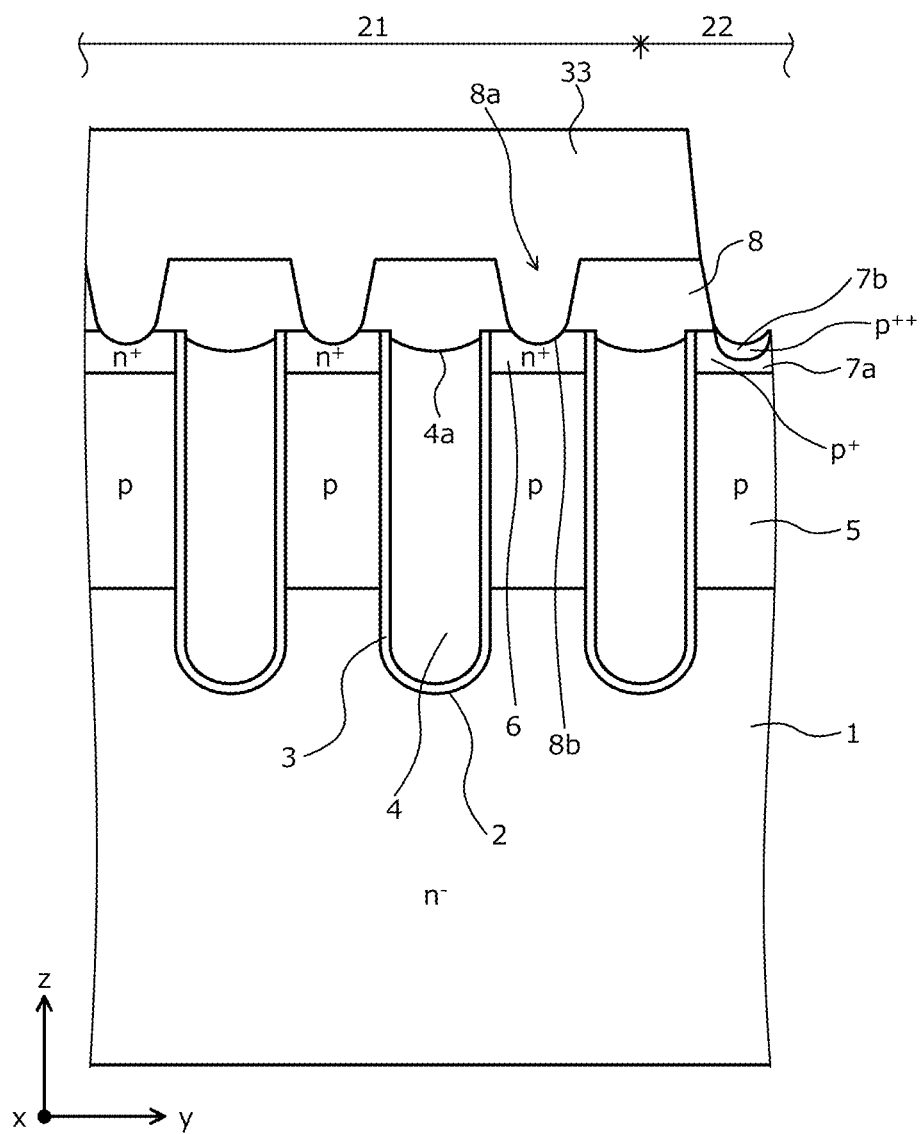
FIG. 12A is a cross-sectional view of the semiconductor device according to the first embodiment during manufacture.
Figure 12B:
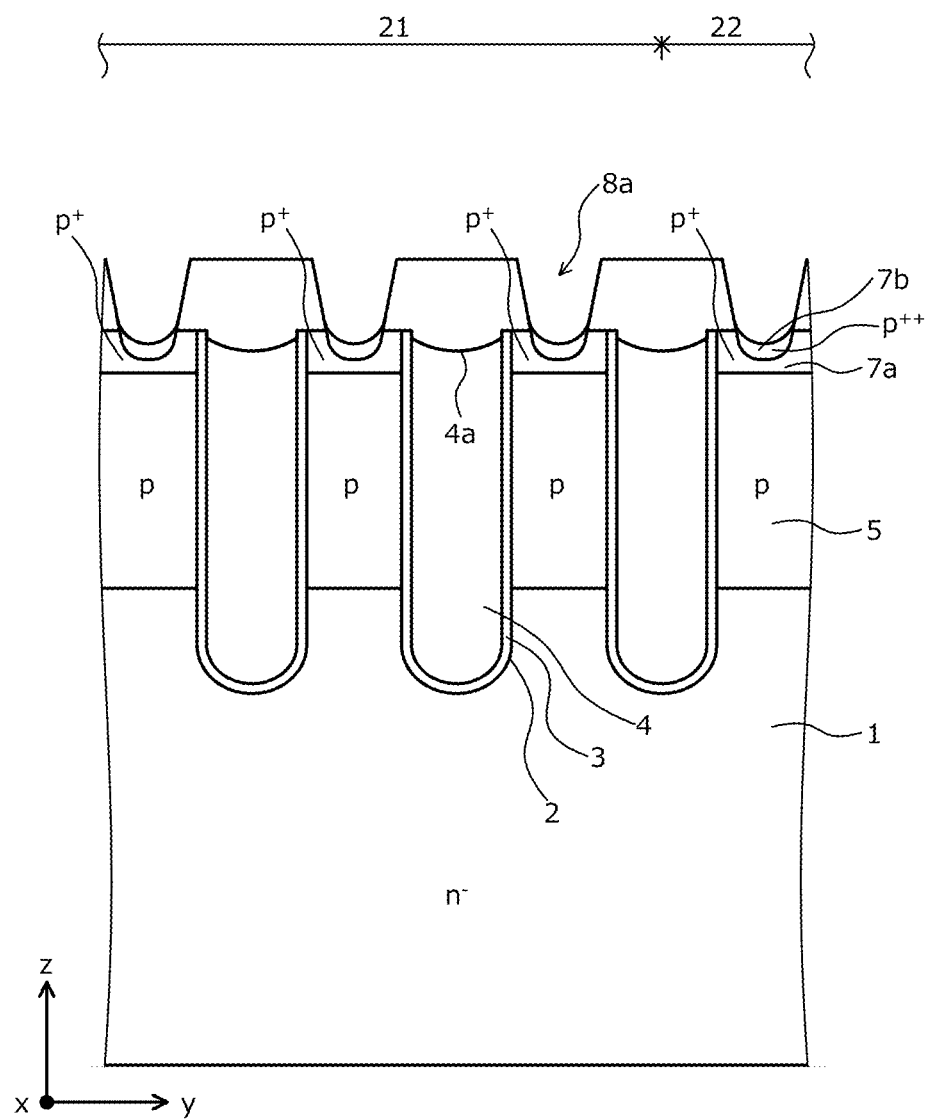
FIG. 12B is a cross-sectional view of the semiconductor device according to the first embodiment during manufacture.

Next, a resist mask 33 having openings at parts corresponding to a formation region of the $p^{++}$-type plug region 7b is formed on the substrate front surface (on the interlayer insulating film 8). For example, the resist mask 33 having openings in a planar layout similar to the resist mask (refer to FIG. 8) for forming the $p^+$-type contact region 7a is formed. Next, the resist mask 33 and the interlayer insulating film 8 are used as a mask and, for example, a p-type impurity such as boron fluorine ($BF_2$) is ion implanted, forming the $p^{++}$-type plug region 7b in the surface layer of the parts of the $p^+$-type contact regions 7a exposed in the contact holes 8a (step S8). The ion implantation at step S8 may be performed with a dose amount of $3 \times 10^{15}/cm^2$ and acceleration energy of 30 keV. The state up to here is depicted in FIGS. 12A and 12B. Next, the resist mask 33 used in the formation of the $p^{++}$-type plug region 7b is removed.

Figure 13A:
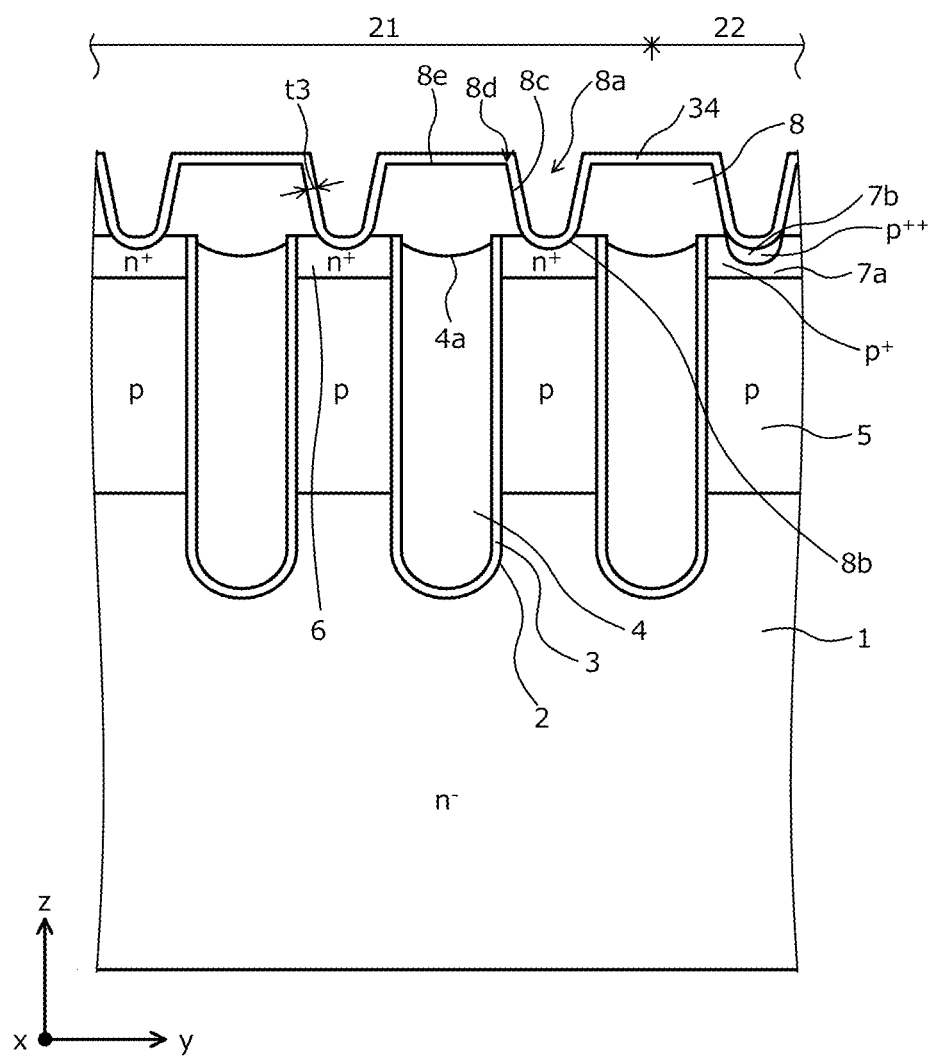
FIG. 13A is a cross-sectional view of the semiconductor device according to the first embodiment during manufacture.
Figure 13B:
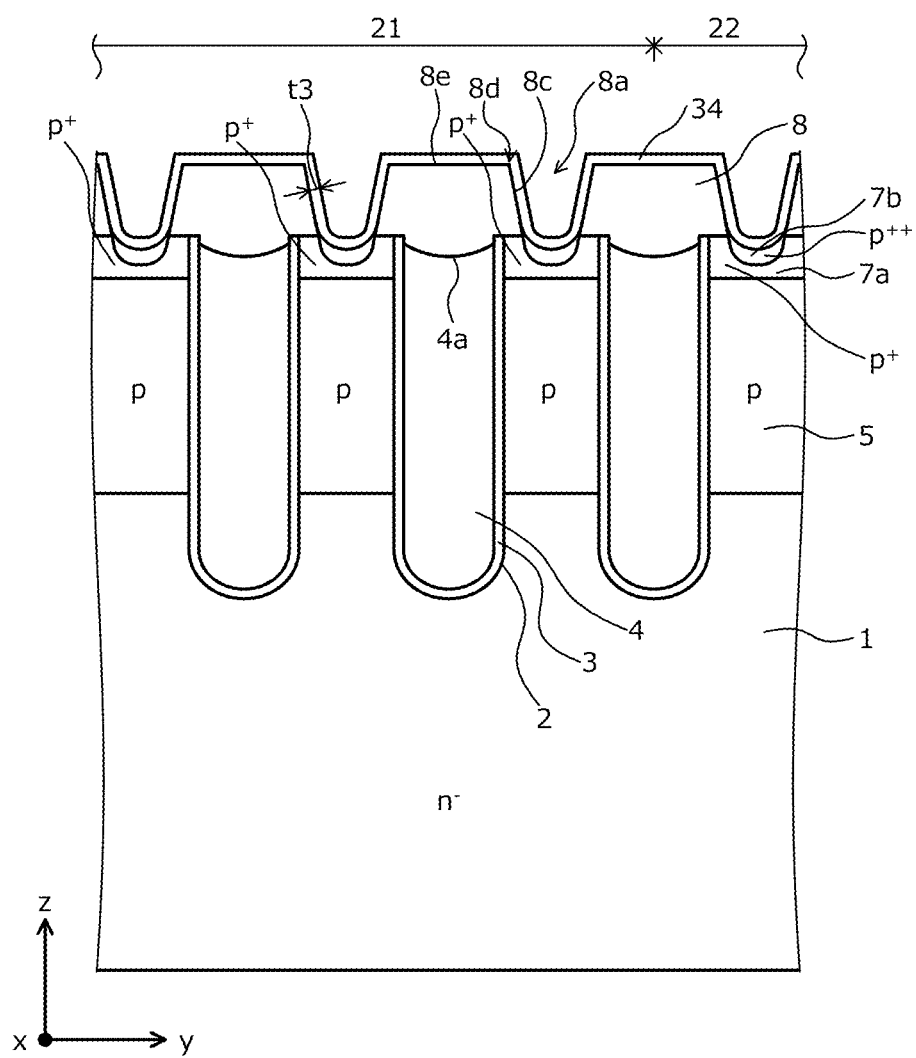
FIG. 13B is a cross-sectional view of the semiconductor device according to the first embodiment during manufacture.

Next, for example, by a sputtering technique, a metal film 34 constituting the barrier metal 9 is formed in the contact holes 8a, along the side surface 8c of the interlayer insulating film 8 and the inner wall of the grooves 8b of the mesa parts (step S9). At this time, the thickness t3 of the metal film 34 is a thickness enabling the grooves 8b of the mesa parts to be embedded with the metal film 34. The metal film 34 has a 2-layer structure in which, for example, a titanium film constituting the first metal film 10 and, for example, a titanium nitride film constituting the second metal film 11 are sequentially stacked (refer to FIG. 4). At step S9, the metal film 34 is formed on the surface of the interlayer insulating film 8 overall so as to extend from the side surface 8c of the interlayer insulating film 8 onto the upper end corner part 8d of the side surface 8c and the top surface 8e. The state up to here is depicted in FIGS. 13A and 13B.

Figure 14A:
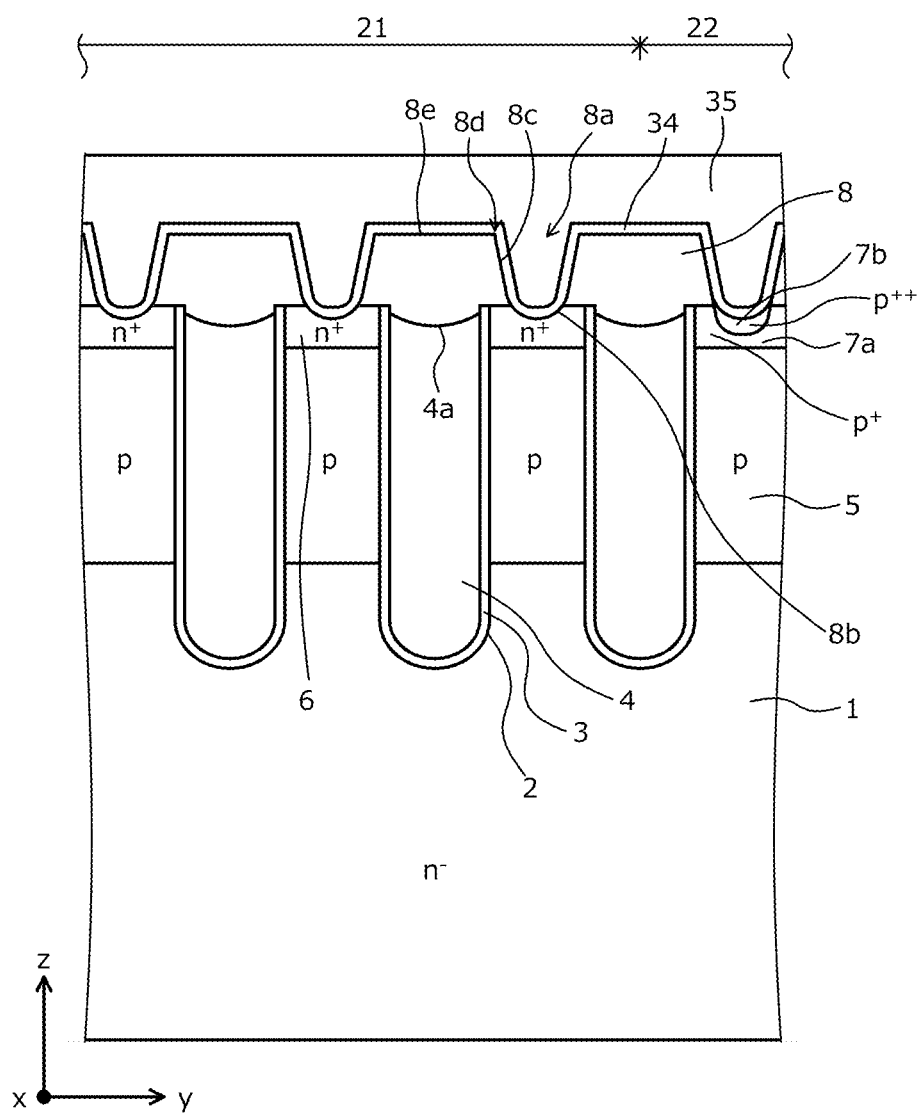
FIG. 14A is a cross-sectional view of the semiconductor device according to the first embodiment during manufacture.
Figure 14B:
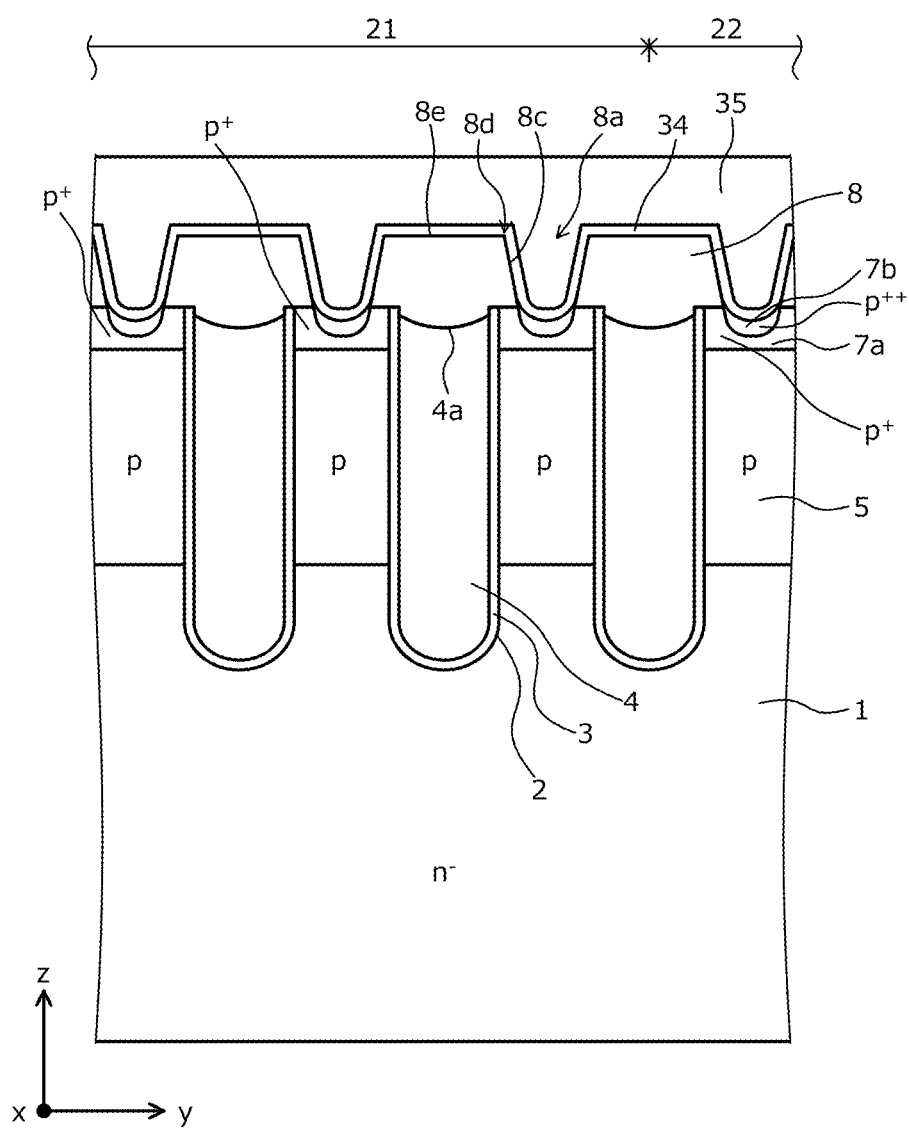
FIG. 14B is a cross-sectional view of the semiconductor device according to the first embodiment during manufacture.

Next, a part of the metal film 34 (e.g., the titanium film constituting the first metal film 10) in contact with a semiconductor part (the $n^+$-type emitter region 6 and the $p^{++}$-type plug region 7b) is converted into a silicide, for example, by heat treatment (annealing) at a temperature of 660 degrees C. (step S10). Next, for example, a tungsten layer 35 constituting the plug electrode 12 is deposited (formed), for example, by a chemical vapor deposition (CVD) method so as to be embedded in the metal film 34 in the contact holes 8a (step S11). At step S11, the tungsten layer 35 is further formed on the surface of the metal film 34 on the top surface 8e of the interlayer insulating film 8. The state up to here is depicted in FIGS. 14A and 14B.

Figure 15A:
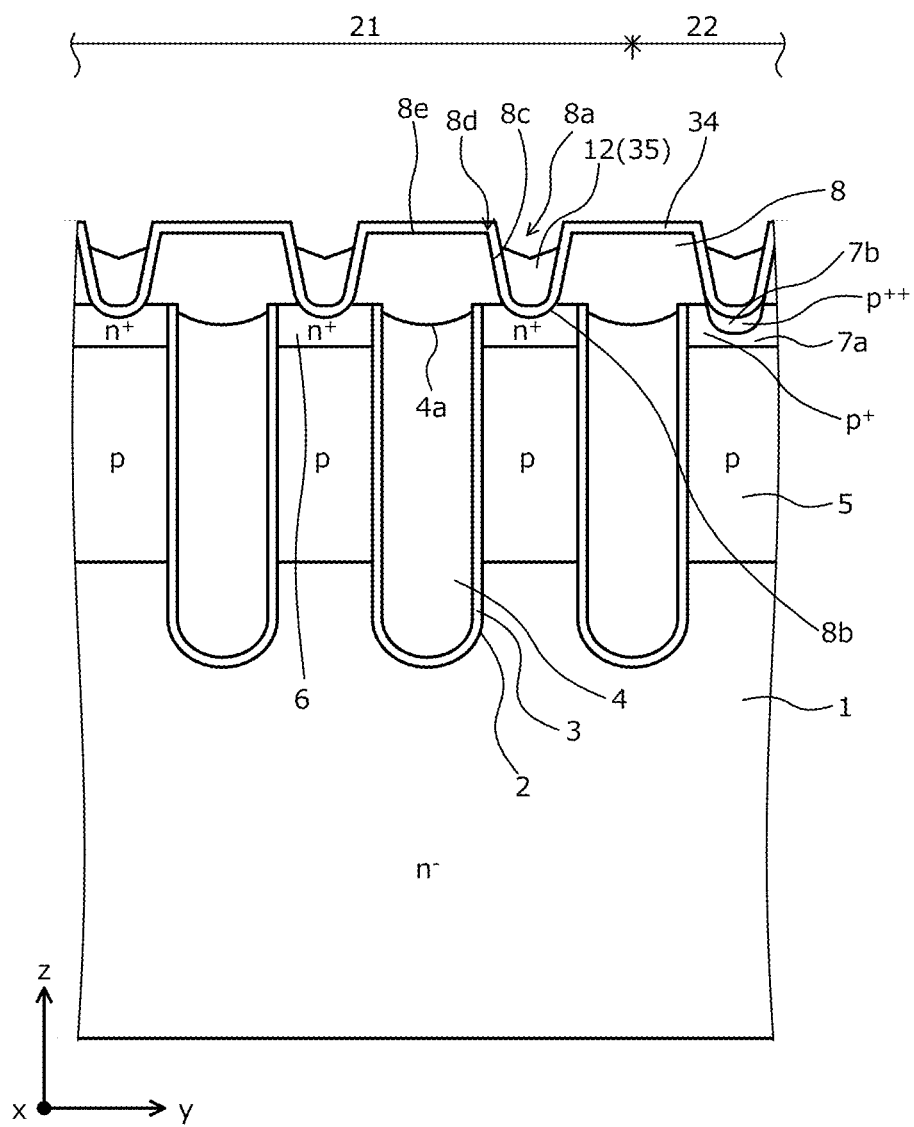
FIG. 15A is a cross-sectional view of the semiconductor device according to the first embodiment during manufacture.
Figure 15B:
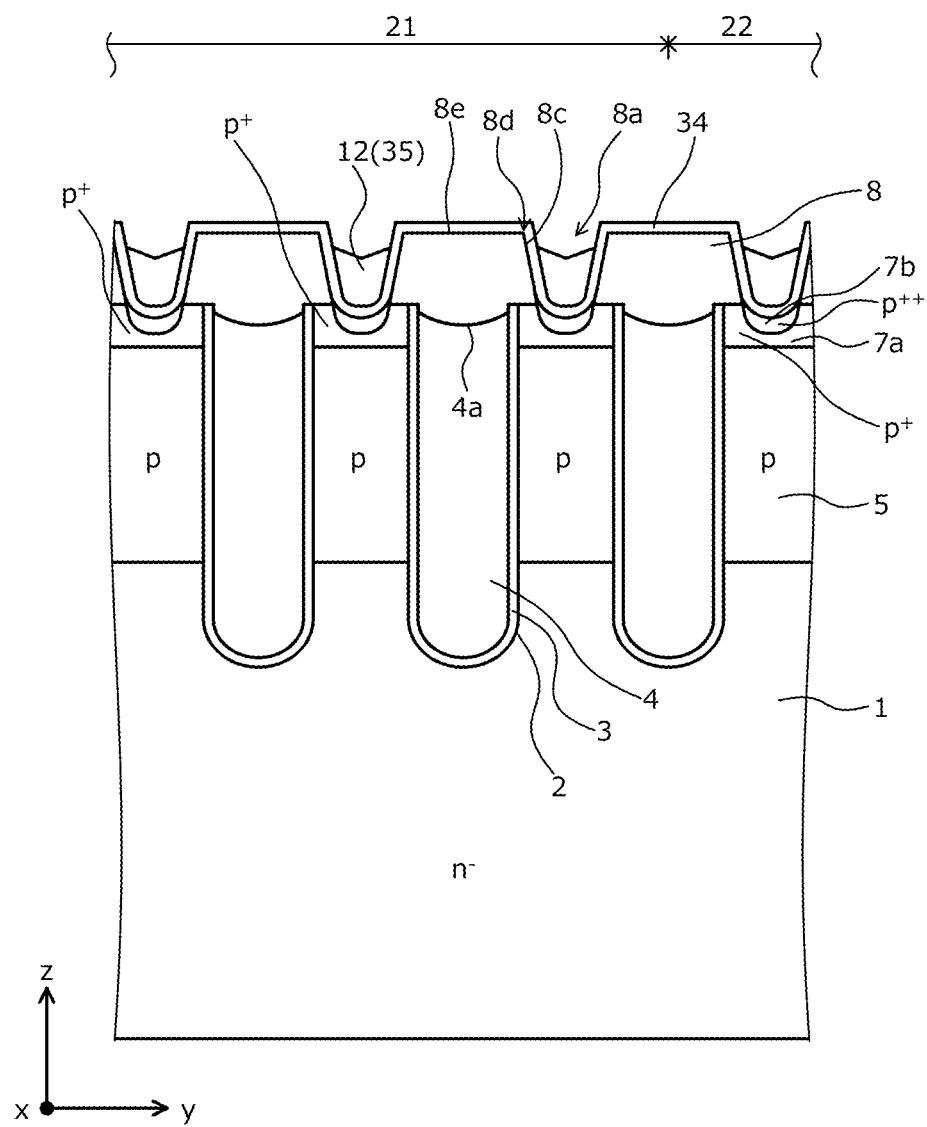
FIG. 15B is a cross-sectional view of the semiconductor device according to the first embodiment during manufacture.

Next, the tungsten layer 35 is subject to etch back until the metal film 34 on the top surface 8e of the interlayer insulating film 8 is exposed (step S12). After the process at step S12, the tungsten layer 35 remaining in each contact hole 8a is the plug electrode 12. The surface of the tungsten layer 35 after being subject to etch back may be at a same height position as the top surface 8e of the interlayer insulating film 8; however, from the perspective of ensuring that the tungsten layer 35 does not remain on the surface of the metal film 34 on the top surface 8e of the interlayer insulating film 8, the surface of the tungsten layer 35 may be subject to etch back so that the tungsten layer 35 is slightly lower than the top surface 8e of the interlayer insulating film 8. In other words, the tungsten layer 35 is subject to etch back until the surface of the tungsten layer 35 is positioned within the contact holes 8a. In this case, the process time of the etch back is adjusted so that the depth d3 of the recess 12a of the top surface of the plug electrode 12 does not become too deep. The state up to here is depicted in FIGS. 15A and 15B.

Figure 16A:
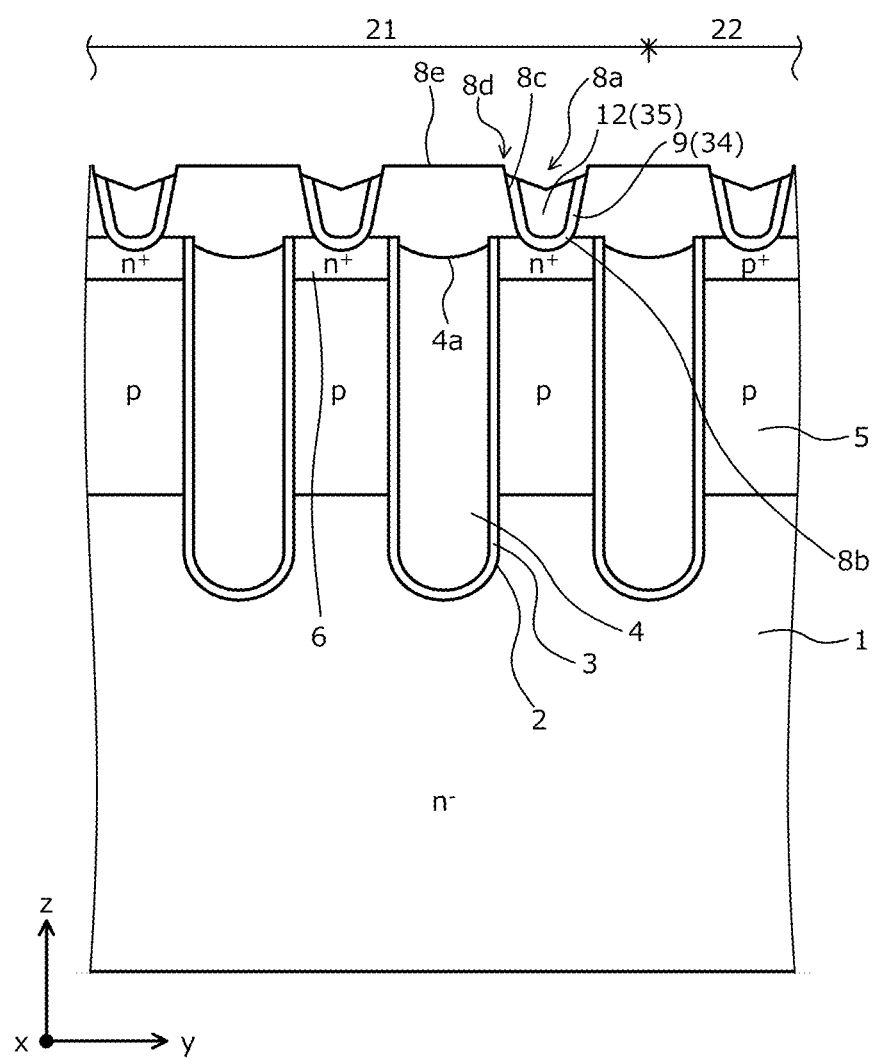
FIG. 16A is a cross-sectional view of the semiconductor device according to the first embodiment during manufacture.
Figure 16B:
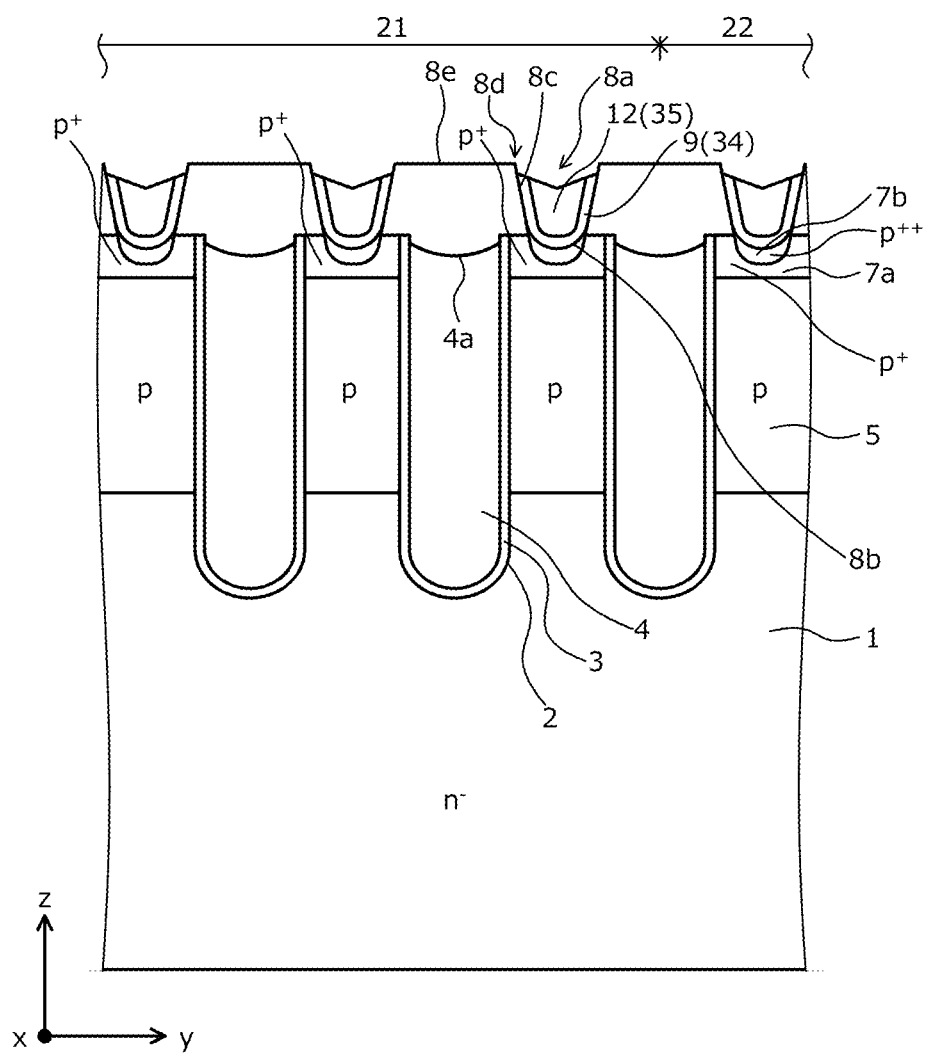
FIG. 16B is a cross-sectional view of the semiconductor device according to the first embodiment during manufacture.

Next, the metal film 34 is subject to etch back until the top surface 8e of the interlayer insulating film 8 is exposed (step S13). After the process at step S13, the metal film 34 remaining in the contact holes 8a is the barrier metal 9. In other words, a part of the barrier metal 9 other than the parts formed on the inner walls of the contact holes 8a is removed by etch back. As described, since the top surface 8e of the interlayer insulating film 8 is substantially flat, the top surface 8e of the interlayer insulating film 8 is entirely exposed substantially concurrently during the etch back of the metal film 34. Further, the process time of the etch back of the metal film 34 is adjusted so that an upper end of the metal film 34 is slightly lower than the top surface 8e of the interlayer insulating film 8 so that the metal film 34 does not remain on the upper end corner part 8d of the side surface 8c of the interlayer insulating film 8. The state up to here is depicted in FIGS. 16A and 16B.

Figure 17A:
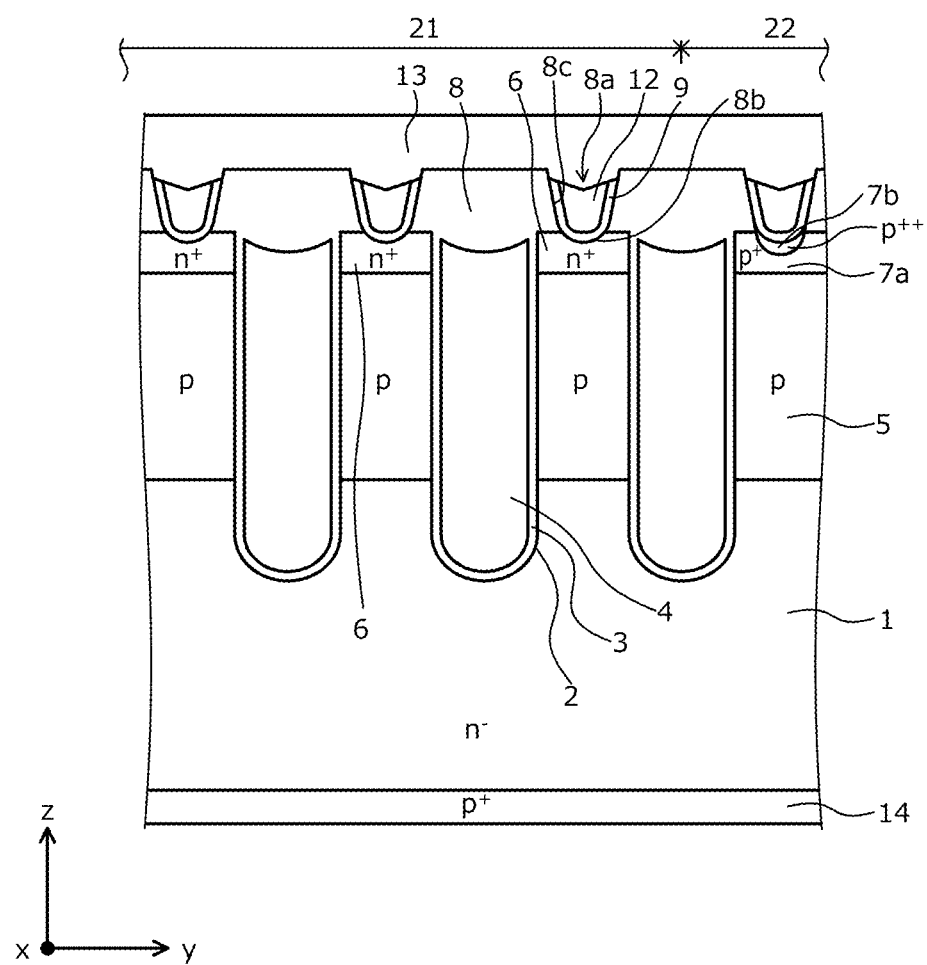
FIG. 17A is a cross-sectional view of the semiconductor device according to the first embodiment during manufacture.
Figure 17B:
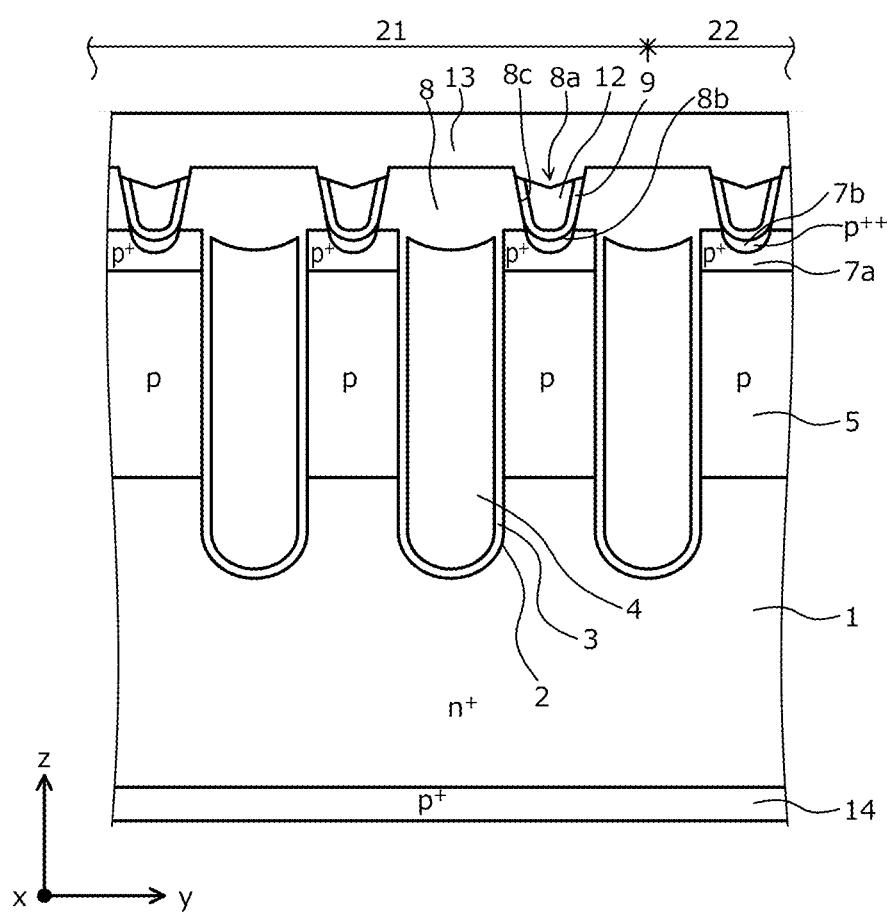
FIG. 17B is a cross-sectional view of the semiconductor device according to the first embodiment during manufacture.

Next, on the interlayer insulating film 8 and the plug electrode 12, the front electrode 13 is formed to have a thickness of about 5 μm, using, for example, aluminum-silicon as a material (step S14). Next, the semiconductor substrate is ground from the rear surface side, to a position of a product thickness used for the semiconductor device (step S15). Next, for example, a p-type impurity such as boron is ion implanted in the substrate rear surface overall, forming the $p^+$-type collector region 14 in the surface layer of the rear surface of the semiconductor substrate overall (step S16). The state up to here is depicted in FIGS. 17A and 17B. Next, on the substrate rear surface, a resist mask (not depicted) having an opening at a part corresponding to a formation region of the $n^+$-type cathode region is formed. Next, the resist mask is used as a mask and, for example, an n-type impurity such as phosphorus is ion implanted, forming the $n^+$-type cathode region 15 in the surface layer of the rear surface of the semiconductor substrate, in the FWD region 22 (step S17).

Next, after the resist mask used in the formation of the $n^+$-type cathode region 15 is removed, the $p^+$-type collector region 14 and the $n^+$-type cathode region 15 are activated by laser annealing (step S18). Next, after the entire substrate front surface is covered by, for example, a passivation film (not depicted) such as a polyimide film, the passivation film is patterned, exposing the front electrode 13 and each electrode pad (step S19). After the rear surface of the semiconductor substrate is ground and before formation of the $p^+$-type collector region 14, formation and patterning of the passivation film may be performed. After the rear surface of the semiconductor substrate is ground, the passivation film of the substrate front surface is formed, whereby the rear surface of the semiconductor substrate may be ground without adverse effects of a level difference of the substrate front surface due to the passivation film. Further, after formation of the front electrode 13 and before grinding of the rear surface of the semiconductor substrate, formation and patterning of the passivation film may be performed.

Next, helium (He) or an electron beam is irradiated from the front surface side or the rear surface side of the semiconductor substrate, thereby introducing into the $n^-$-type drift layer 1, lattice defects constituting a lifetime killer, whereby the lifetime of carriers in the $n^-$-type drift layer 1 is reduced (step S20). Lattice defects also occur in the mesa parts due to this lifetime control. When lattice defects occurring in the mesa parts are present in a part along the MOS gates of the mesa parts, the gate threshold voltage decreases. A part along a MOS gate of a mesa part is a part of the p-type base region 5 sandwiched between the $n^+$-type emitter region 6 and the $n^-$-type drift layer 1, i.e., a part formed by an n-type inversion layer (channel) in the ON state. Therefore, next, in a hydrogen ($H_2$) atmosphere, for example, heat treatment (hydrogen annealing) at a temperature of 350 degrees C. is performed, recovering the lattice defects of the mesa parts (step S21).

As described, during the hydrogen annealing at step S21, on the top surface 8e and the upper end corner part 8d of the side surface 8c of the interlayer insulating film 8, the barrier metal 9 is not present. Thus, diffusion of hydrogen atoms in the hydrogen atmosphere is not suppressed by the barrier metal 9 and therefore, the hydrogen atoms pass through the front electrode 13 and the interlayer insulating film 8, and reach the lattice defects of the mesa parts. As a result, the lattice defects of the mesa parts are recovered, enabling the gate threshold voltage to be recovered to about a same level as before the irradiation of the helium or electron beam. Next, the rear electrode 16 is formed at the rear surface of the semiconductor substrate overall, in contact with the $p^+$-type collector region 14 and the $n^+$-type cathode region 15 (step S22). Thereafter, the semiconductor wafer is cut (diced) into individual chips, completing the RC-IGBT having the trench gate structure depicted in FIGS. 1 to 4.

As described, according to the first embodiment, the barrier metal is subject to etch back continuous with the etch back of the plug electrodes, whereby the top surface of the interlayer insulating film may be easily exposed. As a result, on the gate electrodes, the front electrode is stacked sandwiching the interlayer insulating film therebetween, and the barrier metal is not present between the front electrode and the interlayer insulating film on the gate electrodes. Therefore, during hydrogen annealing, hydrogen atoms may pass through the interlayer insulating film from the front electrode side and reach the mesa parts. Thus, even when lattice defects are generated in the mesa parts by the helium or electron beam irradiation for the lifetime control and the gate threshold voltage decreases, recovery effects of the gate threshold voltage by the hydrogen annealing may be easily and stably obtained. Further, according to the first embodiment, the barrier metal is not present on the top surface of the interlayer insulating film, whereby the top surface part of the interlayer insulating film becomes an escape path for charge accumulated in the gate insulating film. As a result, charge does not remain in the gate insulating film, enabling the durability of the gate insulating film to be enhanced compared to the first conventional structure in which the entire surface of the interlayer insulating film is covered by the barrier metal.

Further, a patterning process for barrier metal and a CMP process for barrier metal are not necessary like in the conventional arts. Therefore, decreases in reliability due to patterning variation of the barrier metal and increases in the number or processes and cost may be prevented. Further, according to the first embodiment, a BPSG film having a higher boron concentration and phosphorus concentration than those of an interlayer insulating film of an ordinary composition is used, whereby fluidity during deposition of the interlayer insulating film and during reflow may be enhanced. Therefore, even when the trench pitch is reduced to decrease size, irrespective of unevenness of the substrate front surface, the top surface of the interlayer insulating film after reflow may be made substantially flat. As a result, the top surface of the interlayer insulating film is exposed substantially concurrently with etch back of the barrier metal and excess barrier metal remaining on the top surface of the interlayer insulating film may be prevented. As a result, recovery effects of the gate threshold voltage may be further enhanced by hydrogen annealing. Further, since the top surface of the interlayer insulating film is exposed substantially concurrently with etch back of the barrier metal, the etch back time of the barrier metal may be reduced as compared to a case in which the interlayer insulating film is formed by an ordinary composition.

Figure 18:
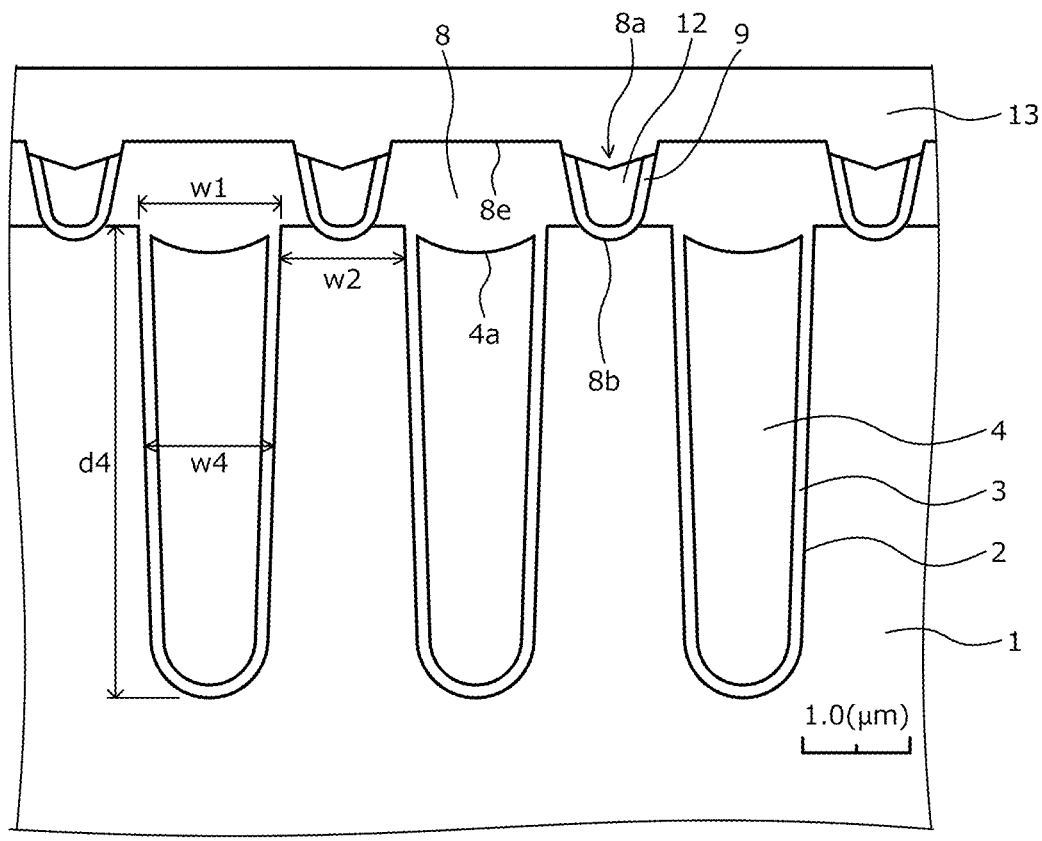
FIG. 18 is a cross-sectional view schematically depicting a state after reflow of an interlayer insulating film of a semiconductor device according to a first example.
Figure 19:
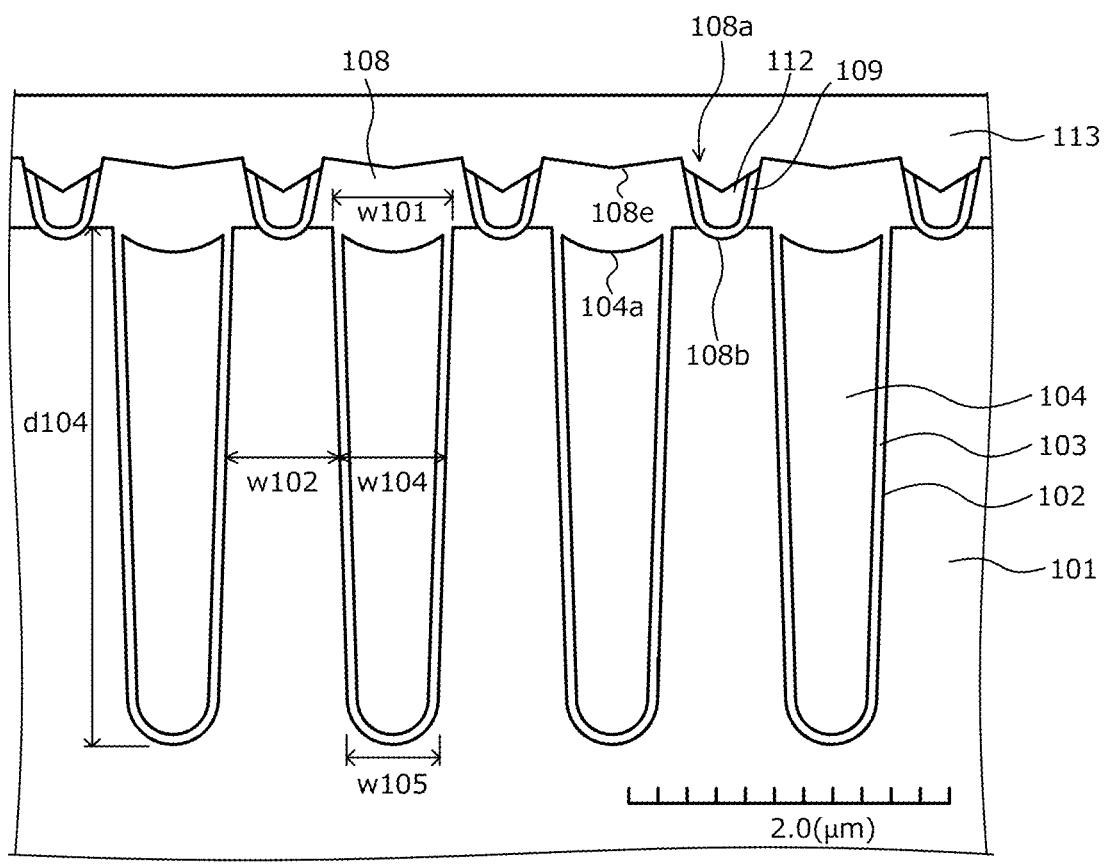
FIG. 19 a cross-sectional view schematically depicting a state after reflow of an interlayer insulating film of a semiconductor device for comparison.

Flatness of the top surface 8*e* of the interlayer insulating film 8 was verified. FIG. 18 is a cross-sectional view schematically depicting a state after reflow of an interlayer insulating film of a semiconductor device according to a first example. FIG. 19 a cross-sectional view schematically depicting a state after reflow of an interlayer insulating film of a semiconductor device for comparison. First, a sample (hereinafter, the first example) was prepared by performing the formation of the MOS gates (step S1) to the formation of the front electrode 13 (step S14) according to the method of manufacturing the semiconductor device according to the first embodiment described above. In other words, in the first example, a BPSG film having a boron concentration and a phosphorus concentration that are higher than those of an interlayer insulating film of an ordinary composition was formed as the interlayer insulating film 8. Formation of the semiconductor regions of the mesa part (steps S2 to S4, S6 above) was omitted. The trench 2 had a width that decreased from an opening side toward the bottom, where the width w1 on the opening side was 1.34 µm and at width w4 near an intermediate depth was 1.13 µm. A depth d4 of the trench 2 was 5.26 µm and the mesa width w2 was 1.06 µm.

For comparison, a sample was prepared by forming an interlayer insulating film 108 of an ordinary composition (hereinafter, comparison example). A method of manufacturing the comparison example was similar to that of the first example excluding the composition of the interlayer insulating film 108 which differed. In the comparison example, while a depth d104 of a trench 102 was slightly deeper than that in the first example, other dimensions were substantially equal to those of the first example. In particular, the trench 102 had a width that decreased from the opening side toward the bottom, where a width w101 on the opening side was 1.35 µm, a width w104 at an intermediate depth was 1.12 µm, and a width w105 of the bottom was 0.92 µm. A depth d104 of the trench 102 was 6.24 µm and a mesa width w102 was 1.32 µm near an intermediate depth of the trench 102. In FIG. 19, reference characters 101, 103, 104, 108*a*, 108*b*, 109, 112, and 113 are an n$^-$-type drift layer, a gate insulating film, a gate electrode, a contact hole, a mesa part groove, a barrier metal, a plug electrode, and a front electrode, respectively.

The states of the interlayer insulating film 8 of the first example and the interlayer insulating film 108 of the comparison example after reflow were observed using a scanning electron microscope (SEM) and the results are depicted schematically in FIGS. 18 and 19. From the results depicted in FIG. 19, in the comparison example, at the substrate front surface, great unevenness was confirmed to occur at a top surface 108*e* of the interlayer insulating film 108 corresponding to unevenness occurring due to a recess 104*a* of the top surface of the gate electrode 104. In contrast, from the results depicted in FIG. 18, in the first example, at the substrate front surface, even when unevenness occurred due to the recess 4*a* of the top surface of the gate electrode 4, the top surface 8*e* of the interlayer insulating film 8 was confirmed to be flat.

Figure 20:
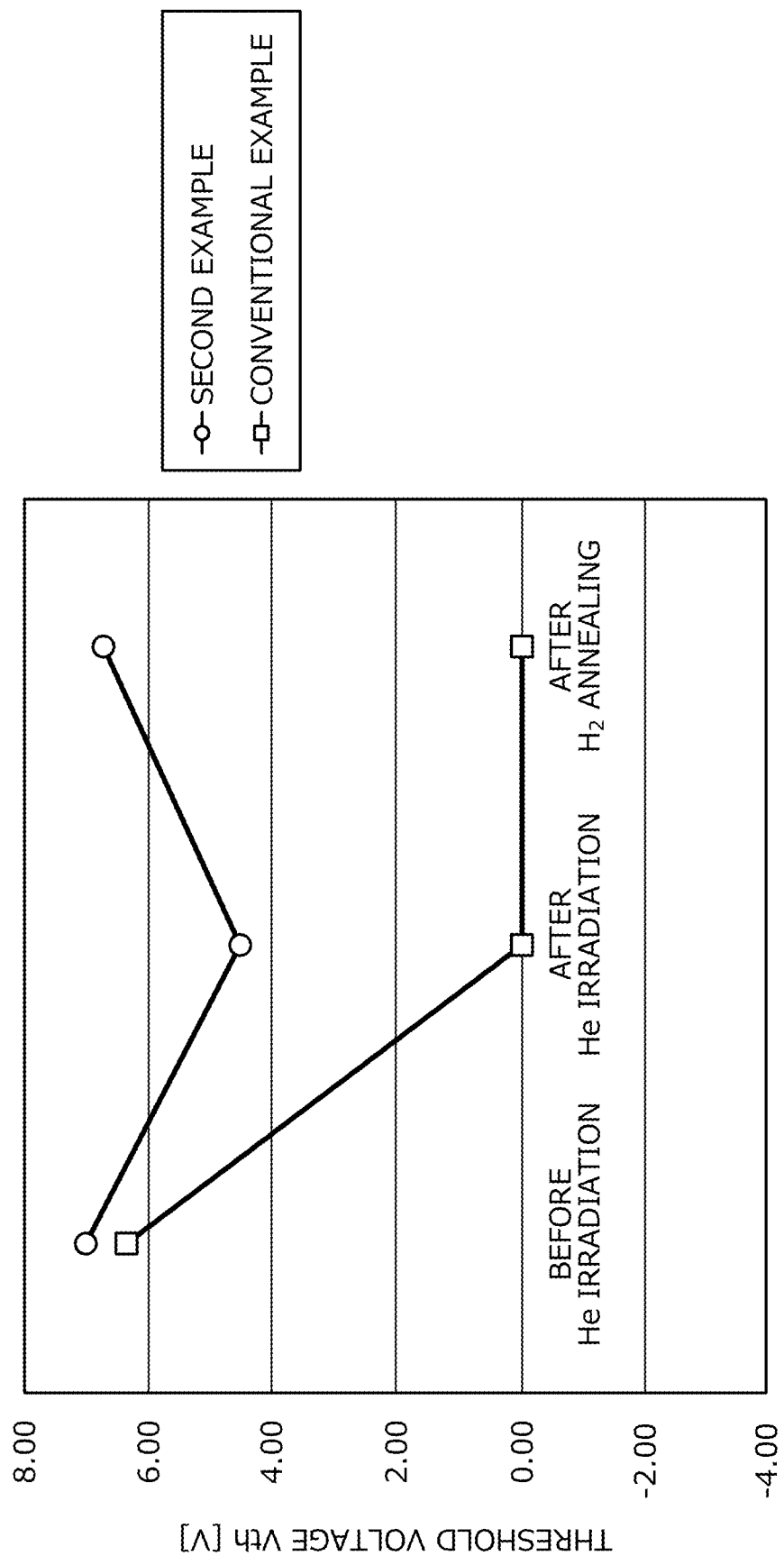
FIG. 20 is characteristics diagram of gate threshold voltage characteristics of a semiconductor device according to a second example.

The gate threshold voltage of the semiconductor device according to the first embodiment was verified. FIG. 20 is characteristics diagram of gate threshold voltage characteristics of a semiconductor device according to a second example. An RC-IGBT (hereinafter, second example) was fabricated according to the method of manufacturing the semiconductor device according to the first embodiment described above under the conditions described above. In other words, in the second example, a BPSG film having a boron concentration and a phosphorus concentration that are higher than those of an interlayer insulating film of an ordinary composition was formed as the interlayer insulating film 8, and the top surface 8*e* of the interlayer insulating film 8 was planarized. Further, in the second example, the barrier metal 9 on the top surface 8*e* of the interlayer insulating film 8 was removed by etch back and, the top surface of the interlayer insulating film 8 and the front electrode 13 were in contact with each other. The lifetime control of irradiating helium was performed (process at step S20).

For comparison, an RC-IGBT (hereinafter, conventional example) was fabricated having the first conventional structure in which a BPSG film of an ordinary composition was formed as an interlayer insulating film and a front electrode was formed on the interlayer insulating film via a barrier metal, without removing the barrier metal that extended onto the top surface of the interlayer insulating film from an inner wall of a contact hole. Manufacturing conditions and configuration of the conventional example excluding the composition of the interlayer insulating film and disposal of the barrier metal were similar to those of the second example. With respect to the second example and the conventional example, the gate threshold voltage was measured before the helium irradiation, and after the subsequent hydrogen annealing; the results are depicted in FIG. 20. Drain current at the time of measurement of the gate threshold voltage was 200 mA.

As depicted in FIG. 20, in the conventional example, the gate threshold voltage was confirmed to greatly decrease due to the helium irradiation and thereafter, even when the hydrogen annealing was performed, the gate threshold voltage could not be recovered. A reason for this is that the diffusion of hydrogen atoms from the front electrode side toward the interlayer insulating film was suppressed by the barrier metal on the top surface of the interlayer insulating film and thus, the hydrogen atoms do not reach the front surface of the semiconductor substrate, whereby the lattice defects of the mesa part could not be recovered. On the other hand, in the second example, variation (decrease) of the gate threshold voltage due to the helium irradiation was confirmed to be less than that in the conventional example. A reason for this is that the barrier metal 9 is not present on the top surface 8e of the interlayer insulating film 8 or on the upper end corner part 8d of the side surface 8c, whereby the hydrogen atoms passed through the front electrode 13 and the interlayer insulating film 8, and reached the lattice defects of the mesa part. Further, in the second example, the gate threshold voltage, which decreased due to the helium irradiation for the lifetime control, was confirmed to be recovered to about a same level as before the helium irradiation, by hydrogen annealing. In other words, it was found that even when the barrier metal 9 on the top surface 8e of the interlayer insulating film 8 is removed by etch back like in the present invention, hydrogen atoms can reach inside the semiconductor substrate during the hydrogen annealing, and the lattice defects of the mesa part can be recovered.

Figure 21:
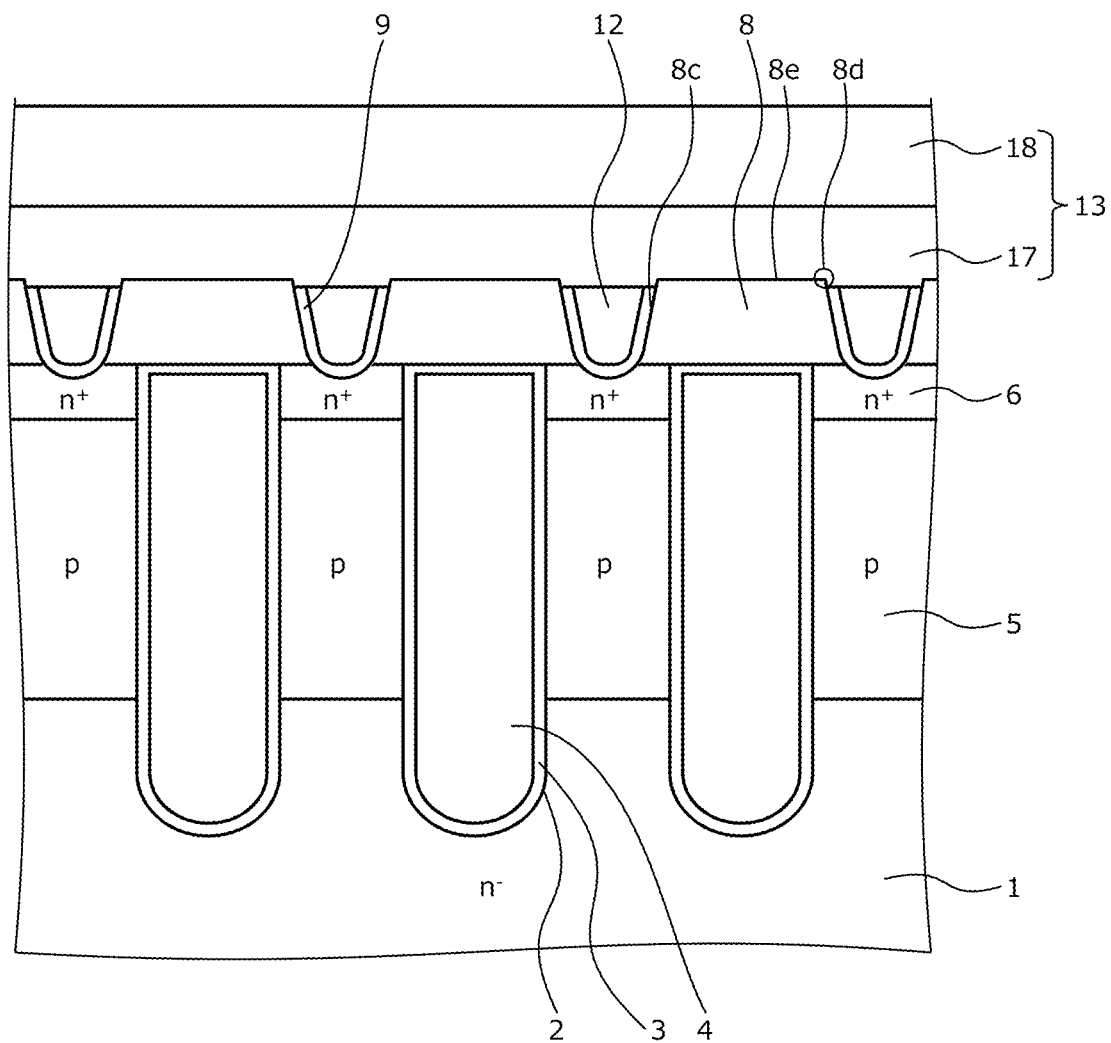
FIG. 21 is a cross-sectional view schematically depicting a normal state of a front electrode of a semiconductor device according to a third example after wiring.
Figure 22:
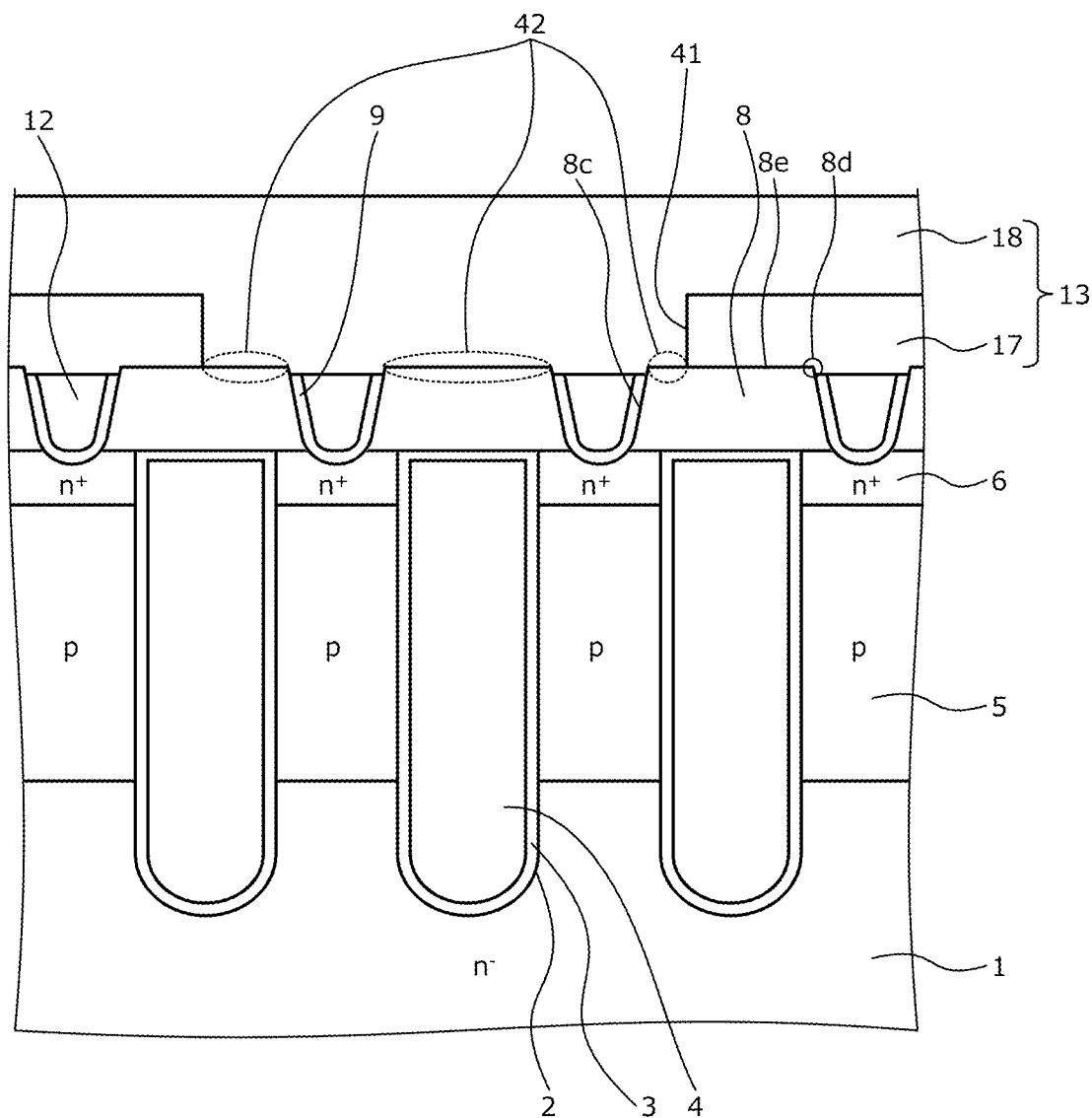
FIG. 22 is a cross-sectional view schematically depicting a state in which a gap of the front electrode of the semiconductor device according to the third example occurs after wiring.

The state of the semiconductor device according to the first embodiment after implementation was verified. A structure of a semiconductor module in which the semiconductor device according to the first embodiment is implemented is described in a third embodiment described hereinafter. FIG. 21 is a cross-sectional view schematically depicting a normal state of a front electrode of a semiconductor device according to a third example after wiring. FIG. 22 is a cross-sectional view schematically depicting a state in which a gap of the front electrode of the semiconductor device according to the third example occurs after wiring. An IGBT (hereinafter, the third example) was fabricated according to the method of manufacturing the semiconductor device according to the first embodiment described above. The front electrode 13 of the third example has a stacked structure in which an aluminum film (may be an aluminum alloy film such as aluminum-silicon, hereinafter, simply "aluminum film" (metal electrode film of the lowest layer)) 17 and a nickel film (may be a nickel alloy film such as nickel-phosphorus, hereinafter, simply "nickel film" (metal electrode film of an upper layer)) 18 are sequentially stacked. The normal state of the third example is depicted in FIG. 21 and a not normal state is depicted in FIG. 22.

The normal state of the third example is a state in which in all regions (for example, the active region) in which the front electrode 13 is disposed, the interlayer insulating film 8 and the plug electrode 12 are covered by the aluminum film 17. The not normal state of the third example is a state in which a gap 41 occurs in the aluminum film 17 at a region in which the front electrode 13 is disposed, and at a location of the gap 41 of the aluminum film 17, the interlayer insulating film 8 or the plug electrode 12 is in contact with the nickel film 18. The gap 41 of the aluminum film 17 is a location where the aluminum film 17 is partially not present between the nickel film 18 and, the interlayer insulating film 8 or the plug electrode 12.

As an example of the gap 41 occurring in the aluminum film 17, for example, foreign matter such as residue (particles) remaining on the interlayer insulating film 8 before formation of the aluminum film 17 may be given. In this case, at a part where the aluminum film 17 covers foreign matter, a film having a raised bump along the foreign matter is formed. At a border of the part having the raised bump due to the foreign matter and a flat part without foreign matter, the thickness of the aluminum film 17 is thin. Therefore, at the surface of the aluminum film 17, when the aluminum film 17 is etched before plating of the nickel film 18, the part of the aluminum film 17 having the raised bump due to the foreign matter is removed with the foreign matter and as depicted in FIG. 22, the gap 41 is likely to occur.

In the first conventional structure (refer to FIG. 23) described above, when the gap 221 occurred in the aluminum film 214, as described above, the crack 223 was confirmed to occur in the interlayer insulating film 210, and the barrier metal 211 and the interlayer insulating film 210 were confirmed to peel due to heat stress resulting from temperature increase of the nickel film 215. Further, cracks in the semiconductor substrate beyond the interlayer insulating film 210 were confirmed. As a result, leak current was confirmed to increase, leading to element destruction such as a state in which leak current constantly flowed and the device could not be turned OFF. In other words, in the first conventional structure, aging at the time of implementation and due to subsequent heat cycles was confirmed to progress quickly, and the life span was confirmed to be shorter than that of the second conventional structure not using plug electrodes.

In contrast, in the third example, in both the normal state (FIG. 21) and the not normal state (FIG. 22), life span (progression of aging) and predetermined characteristics of about a same level as those of the second conventional structure were confirmed to be maintained. A reason for this is as follows. The barrier metal 9 having high adhesiveness with the nickel film 18 is not present on the top surface 8e of the interlayer insulating film 8 or the upper end corner part 8d of the side surface 8c. Therefore, the nickel film 18 contacts the interlayer insulating film 8 at the top surface 8e of the interlayer insulating film 8 and the upper end corner part 8d of the side surface 8c (part encompassed by dashed line indicated by reference numeral 42). As a result, adhesion of the nickel film 18 and the interlayer insulating film 8 is lower as compared to the first conventional structure in which the surface of the interlayer insulating film 210 overall is covered by the barrier metal 211. Therefore, heat stress due to temperature increase of the nickel film 18 at the time of implementation and subsequent heat cycles is less likely to be applied to the interlayer insulating film 8 cracks do not occur in the interlayer insulating film 8. Further, the interlayer insulating film 8 does not peel and therefore, insulation by the interlayer insulating film 8 may be maintained at about a same level as that of the second conventional structure. Further, the plug electrode 12 has a high mechanical strength and therefore, even when adhesion of the nickel film 18 and the plug electrode 12 is high, cracks caused by heat stress due to temperature increase of the nickel film 18 do not occur in the plug electrode 12. Further, even assuming that the plug electrode 12 peels from the contact hole 8a due to heat stress resulting from temperature increase of the nickel film 18, the inventor confirmed that insulation by the interlayer insulating film 8 could be secured, and that the element operated properly.

Figure 25:
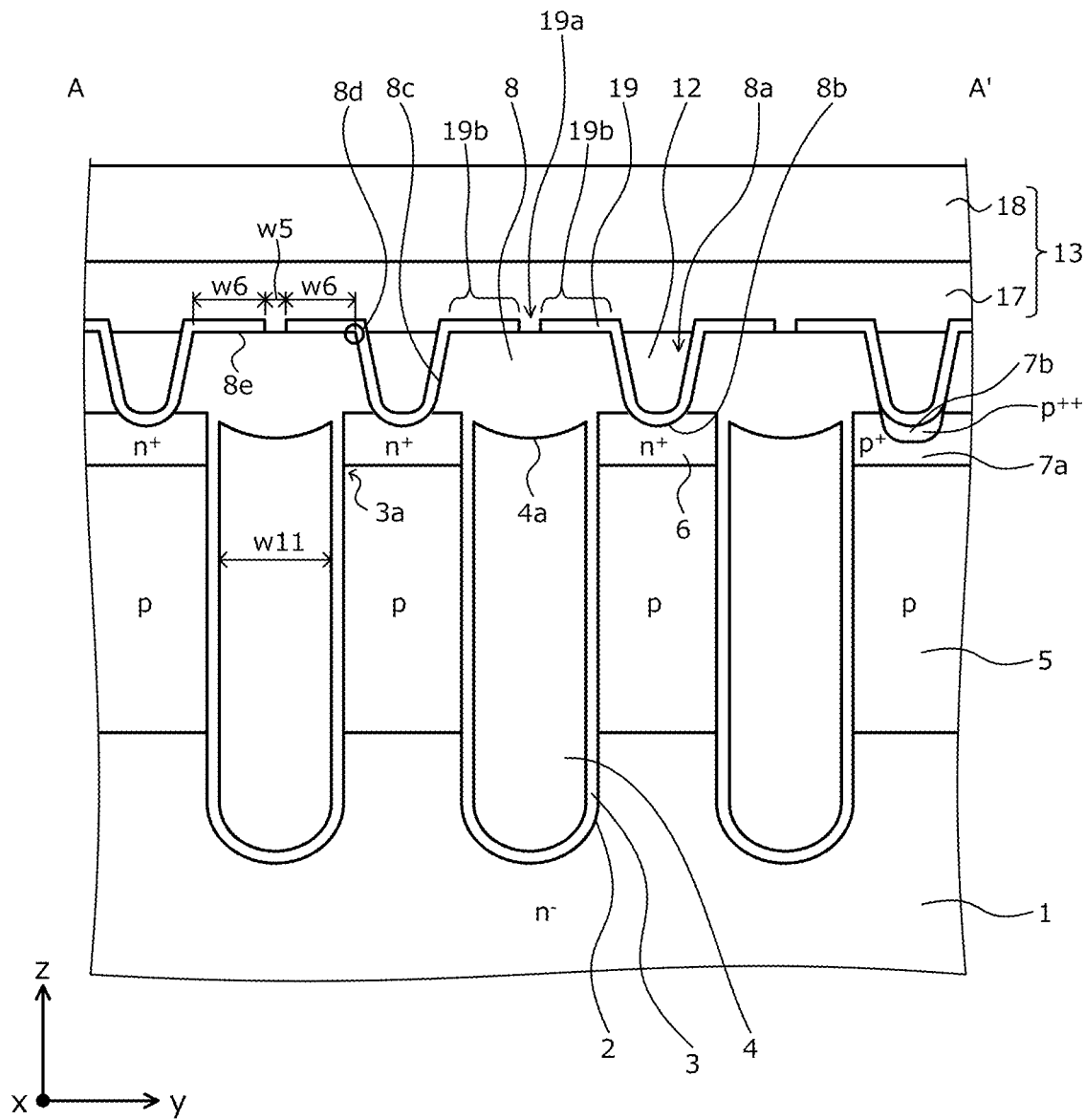
FIG. 25 is a cross-sectional view of a structure of the semiconductor device according to a second embodiment.

A structure of the semiconductor device according to a second embodiment will be described. FIG. 25 is a cross-sectional view of a structure of the semiconductor device according to the second embodiment. FIG. 25 depicts a cross-sectional view of the structure at cutting line A-A' in FIG. 1. Although a cross-sectional view of the structure of the semiconductor device according to the second embodiment at cutting line B-B' in FIG. 1 is not depicted, in the cross-sectional view depicted in FIG. 3, configuration is similar to that depicted in FIG. 25, in which a barrier metal 19 and a slit 19a described hereinafter are additionally provided.

Figure 26:
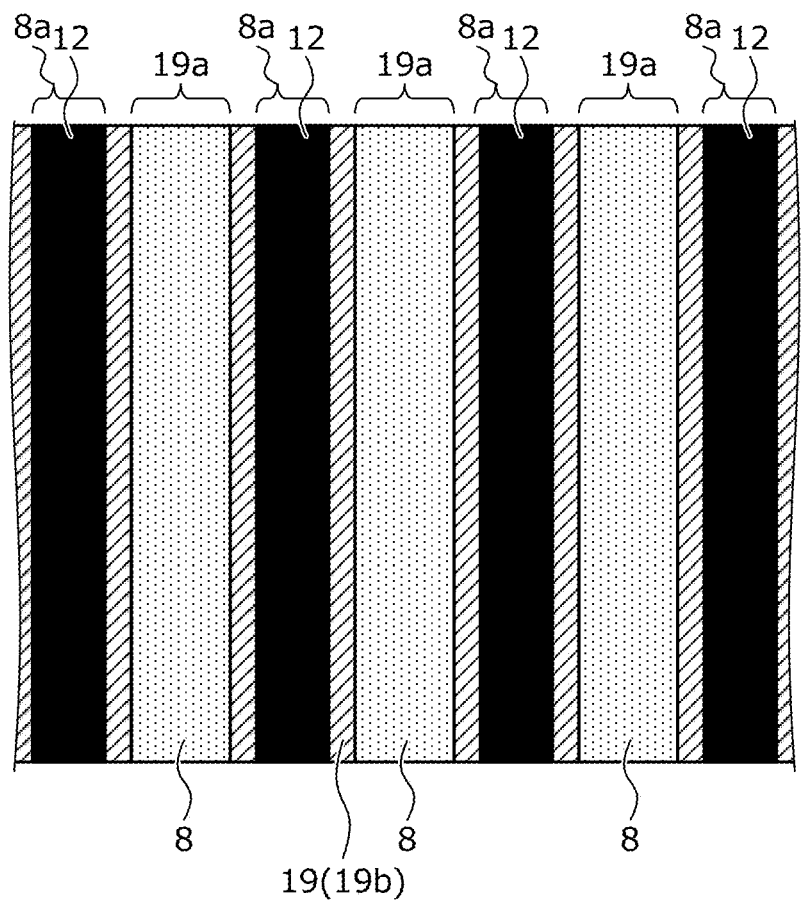
FIG. 26 is a plan view of a layout when viewing a slit of a barrier metal in FIG. 25 from a front surface side of a semiconductor substrate.
Figure 27:
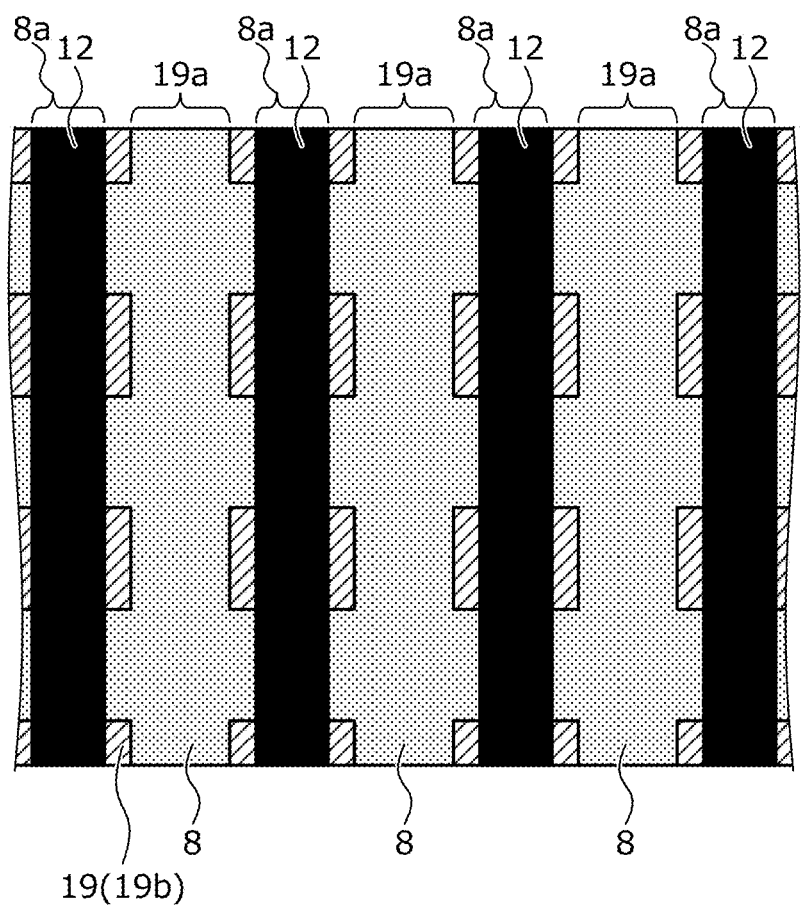
FIG. 27 is a plan view of another example of a layout when viewing a slit of the barrier metal in FIG. 25 from the front surface side of the semiconductor substrate.

FIG. 26 is a plan view of a layout when viewing a slit of the barrier metal in FIG. 25 from the front surface side of the semiconductor substrate. FIGS. 27 and 28 are plan views of other examples of a layout when viewing a slit of the barrier metal in FIG. 25 from the front surface side of the semiconductor substrate. FIGS. 26 to 28 do not depict the front electrode 13 and depict a state in which the top surface 8e of the interlayer insulating film 8 is exposed at the slit 19a of the barrier metal 19.

The semiconductor device according to the second embodiment differs from the semiconductor device according to the first embodiment in that not only are the side surface 8c of the interlayer insulating film 8 and the inner wall of the groove 8b of the mesa part covered by the barrier metal 19, but the upper end corner part 8d of the side surface 8c and the top surface 8e of the interlayer insulating film 8 are further covered and the slit 19a is provided at a part of the barrier metal 19. The slit 19a is a groove (second groove) that penetrates the barrier metal 19 in a thickness direction and reaches the interlayer insulating film 8.

In other words, a part of the interlayer insulating film 8 is exposed at the slit 19a of the barrier metal 19. The front electrode 13 is embedded in the slit 19a of the barrier metal 19. FIG. 25, for example, depicts a case where the front electrode 13 has a 2-layer structure in which the aluminum film 17 and the nickel film 18 are sequentially stacked, and the aluminum film 17 of the lowest layer of the front electrode 13 is embedded in the slit 19a of the barrier metal 19.

The slit 19a of the barrier metal 19, for example, may be disposed at a position exposing the top surface 8e of the interlayer insulating film 8. Reasons for this, for example, are as follows. A first reason is that effects similar to those of the first embodiment (the slit 19a is not provided in the barrier metal 19) are obtained. A second reason is that during hydrogen annealing, hydrogen reaches inside the semiconductor substrate through a region of the slit 19a where the barrier metal 19 is not present, enabling the lattice defects of the mesa part to be recovered. A third reason is that variation of the thickness of the barrier metal 19 may be suppressed, facilitating stable securement of adhesiveness of the barrier metal 19 and the interlayer insulating film 8.

Further, the slit 19a may be provided in plural in the barrier metal 19. Even when the slit 19a is provided in plural in the barrier metal 19, all of the slits 19a, for example, are disposed a positions exposing the top surface 8e of the interlayer insulating film 8. As a result, during hydrogen annealing, hydrogen reaches inside the semiconductor substrate through a region of the slit 19a where the barrier metal 19 is not present, enabling the lattice defects of the mesa part to be recovered. Further, compared to a case in which some (or all) of the slits 19a are provided at the side surface 8c of the interlayer insulating film 8, adhesiveness of the interlayer insulating film 8 and the aluminum film 17 may be secured.

The barrier metal 19 covers the top surface 8e of the interlayer insulating film 8, at a location other than that where the slit 19a is provided. Therefore, when a gap (refer to reference numeral 41 in FIG. 22) occurs in the aluminum film 17, the barrier metal 19 and the nickel film 18 of the upper layer of the aluminum film 17 may contact each other at the top surface 8e of the interlayer insulating film 8; however, no problem like that described of the first conventional structure (refer to FIG. 23) occurs. A reason for this is that the slit 19a is provided, whereby through the barrier metal 19, a mathematical area of the contact of the interlayer insulating film 8 and the nickel film 18 decreases and the heat stress applied to the interlayer insulating film 8 decreases.

Further, even when the top surface 8e of the interlayer insulating film 8 and the upper end corner part 8d of the side surface 8c are partially covered by the barrier metal 19, the recovery effects of the gate threshold voltage by the hydrogen annealing at step S21 may be secured. A reason for this is that at the top surface 8e of the interlayer insulating film 8, diffusion distance of hydrogen in Si (semiconductor substrate) is sufficiently greater than a width (hereinafter, a remaining width w6 of the part 19b of the barrier metal 19 on the top surface 8e of the interlayer insulating film 8) w6 of the barrier metal 19 that remains. The remaining width w6 of the part 19b of the barrier metal 19 on the top surface 8e of the interlayer insulating film 8 is the width, along the second direction y, of parts opposing each other across the slit 19a of the barrier metal 19 on the top surface 8e of the interlayer insulating film 8.

Further, the slit 19a of the barrier metal 19, for example, may be provided in a striped layout extending substantially along the first direction x similarly to the contact holes 8a, as viewed from the front surface side of the semiconductor substrate (refer to FIG. 26). As a result, during hydrogen annealing, hydrogen reaches inside the semiconductor substrate through a region of the slit 19a where the barrier metal 19 is not present, enabling the lattice defects of the mesa part to be recovered. Further, the side wall of the slit 19a of the barrier metal 19 may be tilted with respect to the surface of the interlayer insulating film 8. In other words, a cross-sectional shape of the slit 19a may be substantially trapezoidal.

Further, the slit 19a of the barrier metal 19, as viewed from the front surface side of the semiconductor substrate, for example, may be provided in a lattice-like layout in which lines extending substantially along the first direction x and lines extending substantially along the second direction y intersect (refer to FIG. 27). In this case, near a center between adjacent contact holes 8a, the slit 19a is disposed in a linear layout extending substantially along the first direction x. Additionally, between adjacent contact holes 8a and near the contact holes 8a, the part 19b of the barrier metal 19 on the top surface 8e of the interlayer insulating film 8 and the slit 19a are disposed to alternate repeatedly along the first direction x.

Further, a slit 19a' of a barrier metal 19', as viewed from the front surface side of the semiconductor substrate, for example, may be provide in a striped layout extending substantially along the second direction y (refer to FIG. 28). In this case, a part 19b' of the barrier metal 19' on the top surface 8e of the interlayer insulating film 8 and the slit 19a' are provided spanning between adjacent contact holes 8a. Additionally, the part 19b' of the barrier metal 19' on the top surface 8e of the interlayer insulating film 8 and the slit 19a' are disposed to alternate repeatedly along the first direction x. In FIGS. 26 to 28, the part of the barrier metal 19 on the side surface 8c of the interlayer insulating film 8 is not depicted.

A width (width along the second direction y) w5 of the slit 19a of the barrier metal 19, for example, may be narrower than a width (i.e., a width (width of the gate electrode 4 along the second direction y) w11) between an interface of the gate electrode 4 and a part of the gate insulating film 3 at the side wall of the trench 2. A reason for this is as follows. A state of a part 3a of the gate insulating film 3 near an interface of the p-type base region and the $n^+$-type emitter region 6 influences the gate threshold voltage the most. The width of w5 of the slit 19a of the barrier metal 19 is made narrower than the width w11 of the gate electrode 4, whereby the part 3a of the gate insulating film 3 most influencing the gate threshold voltage may be covered by the barrier metal 19, via the interlayer insulating film 8 along the depth direction z. Therefore, the remaining width w6 of the part 19b of the barrier metal 19 on the top surface 8e of the interlayer insulating film 8 may be a width enabling the part of the gate insulating film 3 at the side wall of the trench 2 to be covered by the barrier metal 19, via the interlayer insulating film 8 along the depth direction z.

A method of manufacturing a semiconductor device according to the second embodiment, for example, includes in the method of manufacturing the semiconductor device according to the first embodiment (refer to FIGS. 5A and 5B), using an etching mask having openings corresponding to formation regions of the slit 19a and selectively etching the barrier metal 19, in place of the process (etch back of the barrier metal) at step S13.

As described, according to the second embodiment, a slit is provided in the barrier metal, whereby a part not covered by the barrier metal at the surface of the interlayer insulating film may be selectively removed, enabling effects similar to those of the first embodiment to be obtained.

Figure 29:
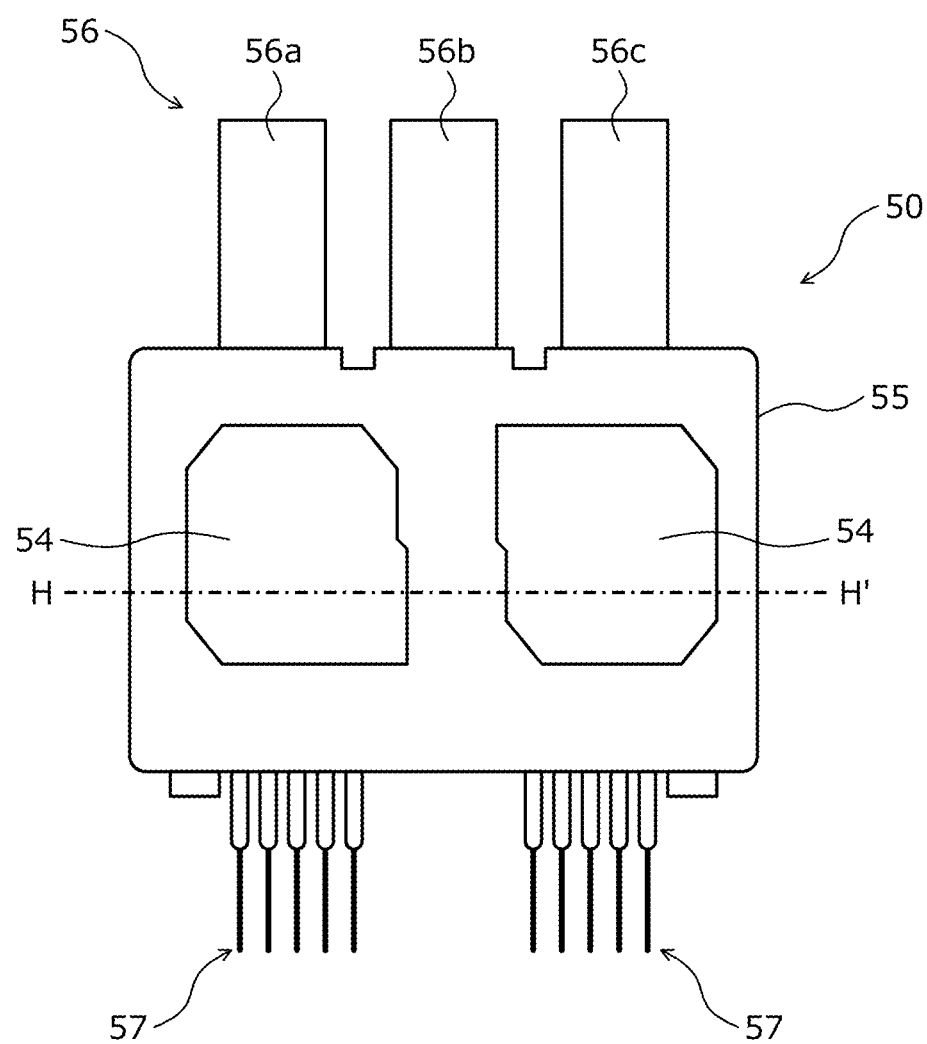
FIG. 29 is a plan view of a layout when viewing a semiconductor module according to a third embodiment from a front surface side of a semiconductor chip.

In the third embodiment, a structure of a semiconductor module in which the semiconductor device according to the first embodiment is implemented will be described. FIG. 29 is a plan view of a layout when viewing the semiconductor module according to the third embodiment from a front surface side of the semiconductor chip. FIG. 30 is a cross-sectional view of a structure at cutting line H-H' in FIG. 29. The semiconductor module according to the third embodiment depicted in FIGS. 29 and 30 is a package 50 in which a semiconductor chip 51 is mounted and that has a structure of the semiconductor device according to the first embodiment. FIGS. 29 and 30 depict a case in which 2 of the semiconductor chips 51 are mounted.

The rear electrode 16 of the semiconductor chip 51 is joined, via a solder layer 61, to a first heat sink 52 disposed on the rear surface side of the semiconductor chip 51. The front electrode 13 of the semiconductor chip 51 is joined, via a solder layer 62, to one main surface of a terminal 53 disposed on the front surface side of the semiconductor chip 51. The terminal 53 has a function of electrically and thermally relaying the semiconductor chips 51 and a second heat sink 54 described hereinafter. The other main surface of the terminal 53 is joined to the second heat sink 54, via a solder layer 63.

In other words, the semiconductor chips 51 are disposed so as to be sandwiched between the first and the second heat sinks 52, 54, and may dissipate heat from both surfaces (the front surface and the rear surface). Joint portions 52a, 54a extending from the first heat sink 52 to which one semiconductor chip 51 of the two the semiconductor chips 51 is joined and from the second heat sink 54 to which the other semiconductor chip 51 is joined are joined via a solder layer 64. As a result, the first and the second heat sinks 52, 54 are electrically connected to each other.

The two semiconductor chips 51, for example, respectively constitute a FWD and an IGBT of a high potential side (upper arm) of two IGBTs serially connected and constituting one phase (not depicted) of a power conversion bridge circuit and a FWD and an IGBT of a low potential side (lower arm). The semiconductor chip 51, one end part of a main terminal 56, and one end part of a signal terminal 57 are sealed by a sealing resin 55 filled between the two semiconductor chips 51 and between the first and the second heat sinks 52, 54 opposing each other and sandwiching the semiconductor chips 51.

As the main terminal 56, at least, a high-potential power supply terminal 56a, a low-potential power supply terminal 56b, and an output terminal 56c respectively connected to one end part of a non-depicted high-potential power supply line, a non-depicted low-potential power supply line, and an output terminal 56c of the package 50 are provided. The one end part of the signal terminal 57 is electrically connected with an electrode pad of the corresponding semiconductor chip 51, via a bonding wire (not depicted). The other end part of the main terminal 56 and the other end part of the signal terminal 57 are lead out from the package 50.

In the foregoing, the present invention, without limitation to the embodiments described, is applicable to semiconductor devices of various configurations that include a plug electrode provided in a contact hole via a barrier metal and various configurations in which problems occur due to lattice defects generated in the semiconductor substrate by irradiation of helium or an electron beam. For example, in the embodiments, while an RC-IGBT in which a trench-gate IGBT and a FWD are provided on a single semiconductor substrate is described as an example, without limitation to a trench gate structure, the present invention is further applicable to a semiconductor device having a planar gate structure in which a MOS gate is provided in a plate-like shape on the substrate front surface. Further, in the embodiments described, while a case in which plural MOS gates are included has been described as an example, even when one MOS gate is included, similar effects are achieved. Further, in the embodiments described, while a case in which a trench having a width that is constant from the opening side toward the bottom has been described as an example, the width of the trench may decrease from the opening side toward the bottom. Further, in the present invention, dimensions, impurity concentrations, etc. of parts are variously set according to required specifications. Further, in the embodiments described, while semiconductor regions constituting the device are formed by diffusion regions formed by ion implantation, without limitation hereto, any one or more of the semiconductor regions constituting the device may be a deposition layer formed by epitaxial growth. Further, other than a plating film formed by an electroless plating method, the nickel film may be a sputtered film formed by a sputtering method. Further, in the present embodiments, while a first conductivity type is as assumed to be an n-type and a second conductivity type is assumed to be a p-type, the present invention is similarly implemented when the first conductivity type is a p-type and the second conductivity type is an n-type.

According to the embodiments of the present invention, the metal film constituting the barrier metal is subject to etch back continuous with the etch back of the metal layer constituting the plug electrode, whereby the top surface (surface on the first electrode side) of the insulating film covering the gate electrode may be exposed. As a result, the first electrode is stacked on the gate electrode sandwiching the insulating film therebetween and the metal film constituting the barrier metal is not present between the insulating film on the gate electrode and the first electrode. Therefore, during hydrogen annealing (heat treatment in a hydrogen atmosphere), hydrogen atoms may pass through the insulating film from the first electrode side and reach the mesa part (part of the semiconductor substrate sandwiched between adjacent trenches). As a result, even when lattice defects are generated in the mesa part by irradiation of light ions or an electron beam for lifetime control and the gate threshold voltage decreases, the lattice defects of the mesa part may be recovered by the hydrogen annealing thereafter, enabling the gate threshold voltage to be recovered.

The semiconductor device and the method of manufacturing a semiconductor device according to the embodiments of the present invention achieve an effect in that even when lifetime control is performed, predetermined characteristics of a semiconductor device having a structure in which a plug electrode is embedded in a contact hole via a barrier metal may be stably and easily obtained.

As described, the semiconductor device and the method of manufacturing a semiconductor device according to the embodiments of the present invention are useful for semiconductor devices having a trench gate structure and are particularly suitable for semiconductor devices having a microstructure of a narrow trench pitch.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
    forming an insulating film on a first main surface of a semiconductor substrate;
    forming a contact hole penetrating the insulating film in a depth direction and reaching the semiconductor substrate;
    forming a metal film from a surface of the insulating film and spanning a semiconductor part of the semiconductor substrate exposed in the contact hole, the metal film adhering to the semiconductor part;
    forming a metal layer on a surface of the metal film so as to be embedded in the metal film in the contact hole;
    performing etch back of the metal layer, removing a part of the metal layer excluding a part embedded in the contact hole, and exposing the metal film;
    performing etch back of an exposed part of the metal film, and exposing the insulating film;
    irradiating helium or an electron beam on the semiconductor substrate;
    performing heat treatment in a hydrogen atmosphere and recovering lattice defects generated by irradiating the helium or the electron beam; and
    forming a gate electrode via a gate insulating film, in each of a plurality of trenches formed at a predetermined depth from the first main surface of the semiconductor substrate, the gate electrode being formed before forming the insulating film, the forming the gate electrode including:
        forming the plurality of trenches in the semiconductor substrate, the plurality of trenches extending in a first direction parallel to the first main surface of the semiconductor substrate;
        forming the gate electrode in each of the plurality of trenches via the gate insulating film so that a surface of the gate electrode is within each of the plurality of trenches;
        forming a first semiconductor region of a second conductivity type in a part of the semiconductor substrate sandwiched between adjacent trenches of the plurality of trenches, the first semiconductor region being formed so as to oppose the gate electrode across the gate insulating film,
        selectively forming second semiconductor regions of a first conductivity type exposed in the first main surface of the semiconductor substrate, in the first semiconductor region, the second semiconductor regions being formed so as to oppose the gate electrode across the gate insulating film, and
        selectively forming third semiconductor regions of the second conductivity type exposed in the first main surface of the semiconductor substrate, in the first semiconductor region, the third semiconductor regions being formed so as to oppose the gate electrode across the gate insulating film, an impurity concentration of the third semiconductor regions being higher than that of the first semiconductor region,
    the second semiconductor regions and the third semiconductor regions being alternatively disposed and each of the second semiconductor regions adjoining each of the third semiconductor regions in the first direction,
    the forming the insulating film including forming the insulating film so as to cover the gate electrode,
    the forming the contact hole including forming the contact hole and forming a first groove in a part of the semiconductor substrate exposed in the contact hole, a depth from the first main surface of the semiconductor substrate, of the first groove being shallower than that of the second semiconductor region, a width of the first groove being equal to a width of the contact hole, and
    the forming the metal film including forming the metal film contacting with the semiconductor part of the semiconductor substrate at an inner wall of the first groove.

2. The method according to claim 1, wherein the forming the insulating film includes forming as the insulating film, a silicon oxide film containing boron at an impurity concentration in a range from 2.6 wt % to 3.8 wt % and phosphorus at an impurity concentration in a range from 3.6 wt % to 4.4 wt %.

3. The method according to claim 1, wherein the performing etch back of the metal layer includes performing etch back of the metal layer until a surface of the metal layer is positioned within the contact hole.

4. The method according to claim 3, wherein the performing etch back of the exposed part of the metal film includes performing etch back of the metal film so that of the insulating film, an upper end of a side surface forming a side wall of the contact hole, is exposed.

5. The method according to claim 1, wherein
the forming the metal film includes forming the metal film so as to be embedded in the first groove.

6. The method according to claim 1, wherein
the forming the insulating film includes forming the insulating film to have a thickness that is at least equal to a width of the contact hole.

7. The method according to claim 1 wherein
the forming the gate electrode is performed before forming the insulating film, and
the forming the insulating film includes forming the insulating film to have at a part thereof other than a part on the gate electrode, a thickness that is at least equal to a width of the contact hole.

8. The method according to claim 7, wherein
the forming the gate electrode includes disposing the trench in plural at an interval narrower than a width of the trench.

9. The method according to claim 7, wherein
the performing the heat treatment includes recovering the lattice defects generated in a part of the semiconductor substrate sandwiched between adjacent trenches.

10. The method according to claim 7, wherein
the forming the gate electrode includes:
  forming the trenches in a first formation region and a second formation region of the semiconductor substrate that is of the first conductivity type, the first formation region having a first semiconductor element formed therein and the second formation region having a second semiconductor element formed therein,
the method further comprising after the performing etch back of the exposed part of the metal film and before the irradiating the helium or the electron beam:
  forming a first electrode in contact with the first semiconductor region and the second semiconductor region of the first formation region and in contact with the first semiconductor region of the second formation region;
  forming in the first formation region, a fourth semiconductor region of the second conductivity type in a surface layer on a second main surface of the semiconductor substrate, and forming in the second formation region, a fifth semiconductor region of the first conductivity type in the surface layer on the second main surface of the semiconductor substrate, the fourth semiconductor region having an impurity concentration that is higher than that of the semiconductor substrate; and
  forming a second electrode in contact with the fourth semiconductor region and the fifth semiconductor region.

11. The method according to claim 1, wherein
the forming the metal film includes forming as the metal film, a titanium film and titanium nitride film that are sequentially stacked.

12. The method according to claim 1, wherein
the forming the metal layer includes forming as the metal layer, a tungsten layer.

13. The method according to claim 1, wherein the depth of the first groove is equal to a thickness of the metal film.

* * * * *